(12) United States Patent
Tanoue et al.

(10) Patent No.: US 7,836,845 B2
(45) Date of Patent: Nov. 23, 2010

(54) SUBSTRATE CARRYING AND PROCESSING APPARATUS

(75) Inventors: Mitsuhiro Tanoue, Koshi (JP); Suguru Enokida, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 869 days.

(21) Appl. No.: 11/734,384

(22) Filed: Apr. 12, 2007

(65) Prior Publication Data

US 2007/0245949 A1 Oct. 25, 2007

(30) Foreign Application Priority Data

Apr. 19, 2006 (JP) .............................. 2006-115367

(51) Int. Cl.
| | |
|---|---|
| B05C 13/02 | (2006.01) |
| B05C 11/00 | (2006.01) |
| B05B 15/12 | (2006.01) |
| B65G 49/07 | (2006.01) |

(52) U.S. Cl. .................. 118/500; 118/503; 118/50; 118/326; 118/712; 118/686; 414/936; 414/940; 414/941; 414/217

(58) Field of Classification Search ................ 118/500, 118/50, 719, 326, 502, 503, 309, 634, 712, 118/713, 668, 676, 686; 414/217, 225.01, 414/226.01, 744.1, 744.2, 744.3, 744.4, 744.5, 414/744.6, 744.7, 744.8, 936–941; 29/846; 156/345.51–345.55

See application file for complete search history.

(56) References Cited

U.S. PATENT DOCUMENTS 6,292,250 B1 9/2001 Matsuyama 6,464,789 B1 10/2002 Akimoto (Continued)

FOREIGN PATENT DOCUMENTS

JP 6-271004 9/1994

(Continued)

*Primary Examiner*—Yewebdar T Tadesse
(74) *Attorney, Agent, or Firm*—Oblon, Spivak, McClelland, Maier & Neustadt, L.L.P.

(57) ABSTRACT

The present invention provides a substrate carrying and processing apparatus which is intended to reduce the size of the space for storing substrates in each substrate storing section as much as possible so as to downsize the apparatus and increase the number of substrates to be stored therein as well as to enhance the throughput. The substrate carrying and processing apparatus comprises a carrier block S1 which is adapted to position carriers 20 each receiving wafers W therein, a processing block S2 including processing units U1 to U4, 31 used for processing each wafer, a main arms A1 adapted to transfer each wafer to each processing unit, a rack unit U5 which is disposed between the carrier block and the processing block and able to store wafers to be processed, and a transfer arm D adapted to transfer each wafer to the rack unit. The rack unit has openings 11, 12 to which the main arm and the transfer arm can transfer each substrate along two directions crossing to each other, and includes a plurality of placing shelves with a space therebetween and adapted to support a wafer. The main arms and transfer arms are configured such that they can be advanced into and retracted from the substrate storing section and such that they can be overlapped to the corresponding placing shelf in the vertical direction, when viewed in the horizontal direction.

19 Claims, 13 Drawing Sheets

U.S. PATENT DOCUMENTS

2002/0009658 A1 * 1/2002 Sato et al. .................. 430/30

FOREIGN PATENT DOCUMENTS

| | | |
|---|---|---|
| JP | 9-74127 | 3/1997 |
| JP | 9-92702 | 4/1997 |
| JP | 2001-53125 | 2/2001 |
| JP | 2001-57336 | 2/2001 |
| JP | 2001-85347 | 3/2001 |
| JP | 2005-203635 | 7/2005 |
| JP | 2006-24682 | 1/2006 |
| JP | 2006-24683 | 1/2006 |

* cited by examiner

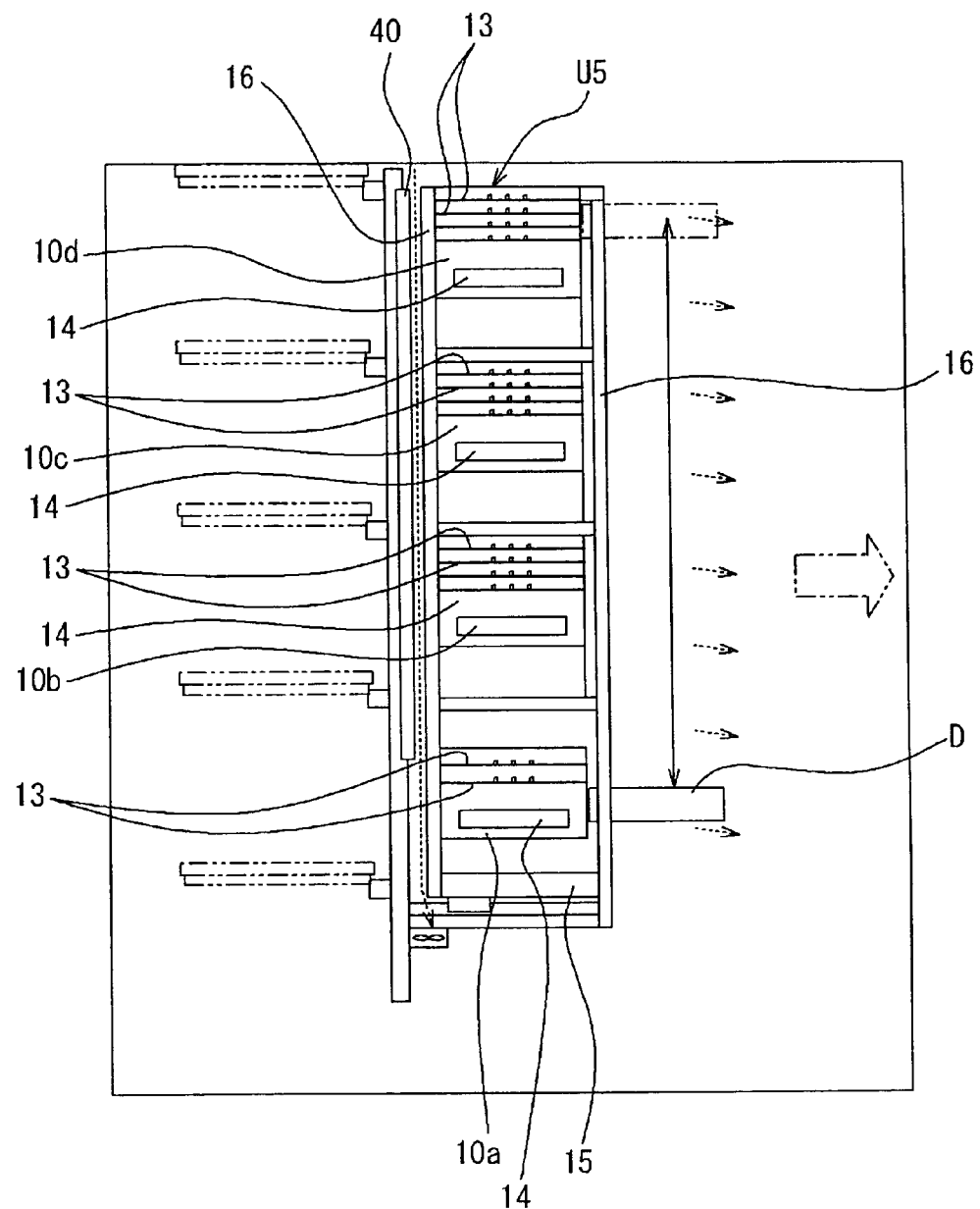
F I G. 5

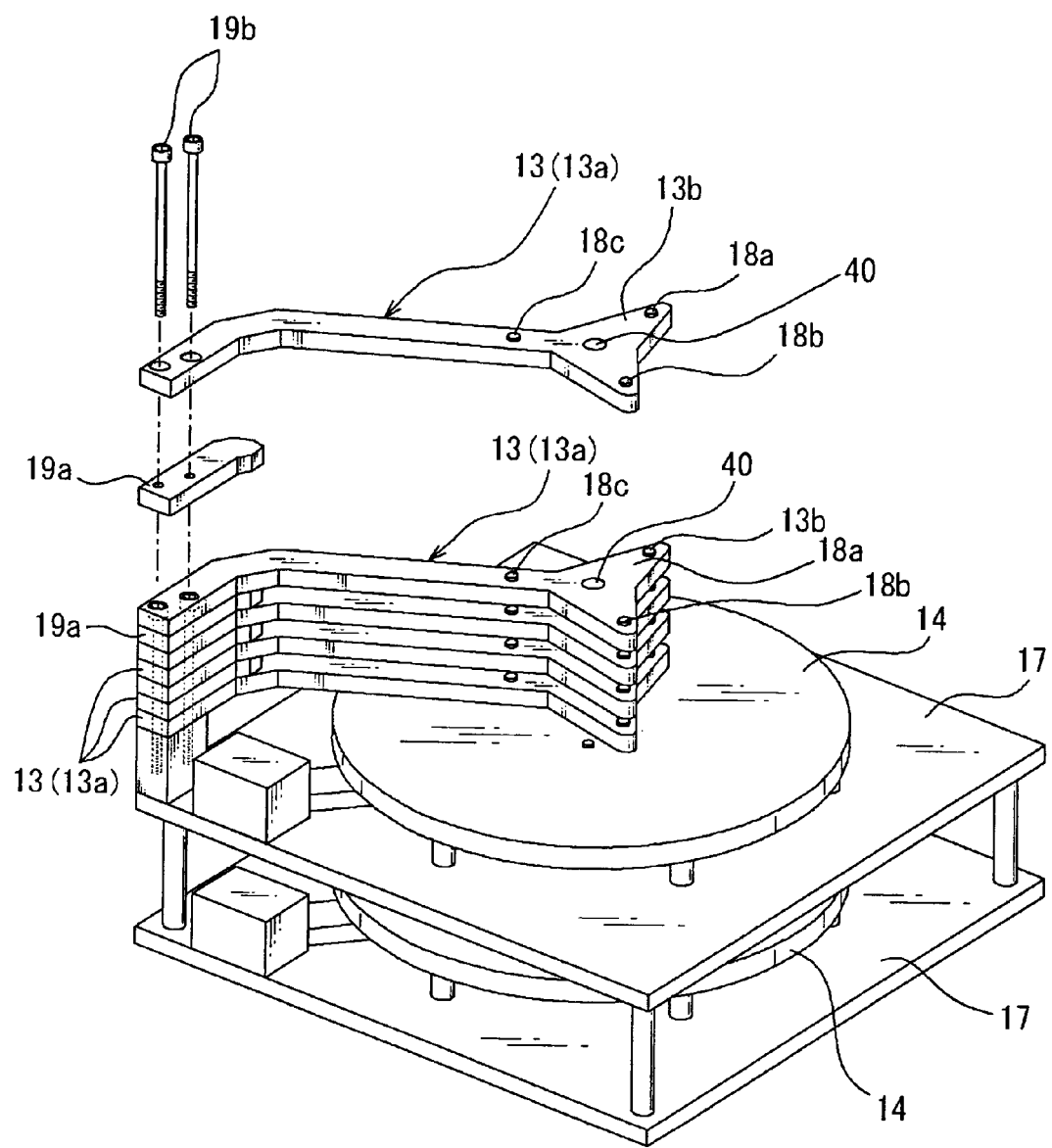
F I G. 7

SUBSTRATE CARRYING AND PROCESSING APPARATUS

BACKGROUND OF THE INVENTION

1. Field of the Invention

The present invention relates to a substrate carrying and processing apparatus which is adapted to carry and process a substrate, for example, a semiconductor wafer or LCD glass substrate.

2. Background Art

Generally, in production of semiconductor devices, a photolithography technique is utilized to form a thin film of ITO (Indium Tin Oxide) and/or electrode pattern on a substrate, such as a semiconductor wafer or LCD glass substrate. The photolithography technique is performed in a series of steps comprising; coating a photoresist on a substrate, exposing the resultant resist film which corresponds to a predetermined circuit pattern, and then developing the exposed pattern so as to form a desired circuit pattern of the resist film.

An apparatus for performing such processes is generally provided with a resist coating and processing unit adapted to coat and process a resist liquid on a substrate, a heating unit adapted to heat a substrate after being subjected to the resist coating and processing step and/or to heat a substrate after being subjected to the exposing step, a cooling unit adapted to cool a substrate after being subjected to the heating process to a predetermined temperature, and a developing unit adapted to develop a resist on a substrate by supplying a developing liquid thereto, wherein these units are stacked individually into a plurality of stages. The transfer and carrying in or carrying out of each substrate between the respective processing units is performed by using a carrying apparatus.

If the substrate is not cooled immediately after the heating process, there is a risk of occurrence of defects due to overheating or over-baking of the substrate. Thus, a pre-cooling unit is provided to have each substrate wait and pre-cool it before it is cooled to a predetermined temperature, wherein a plurality of substrate carrying apparatuses serve to carry respective substrates between the resist coating and processing unit and the heating unit, between the heating unit and the cooling unit, and between the pre-cooling unit and the cooling unit (e.g., see Patent Document 1).

In order to efficiently carry each substrate, corresponding to a time difference of each processing time for the substrate in each processing unit and enhance the throughput, delivery or transfer of substrates is performed by using separate substrate carrying apparatuses respectively adapted to move in two directions relative to a plurality of substrate storing sections, which are arranged into multiple stages to respectively store a plurality of substrates therein, and which are provided between processing blocks each provided with a plurality of processing units, or in an interface block (e.g., see Patent Document 2).

Depending on the type of the resist film to be used, the coating mode varies with cases, including the case of forming an antireflection film both on and under the resist film, the case of forming such an antireflection film either on or under the resist film, and the case of not forming the antireflection film and processing the resist film alone. Accordingly, the processing conditions for forming a coating film in the respective processing units, i.e., the coating and processing unit, heating unit, cooling unit and pre-cooling unit, should sometimes be changed depending on each lot. In such a case, and in such configuration that the coating and processing unit, heating unit, cooling unit and the like are provided in the same processing block, the flow mode to carry the substrate varies with alteration of the units to be used depending on the type of the resist film. Therefore, the carrying schedule for respective substrates should be more complicated. If the number of sheets of the substrates to be stored in each substrate storing section described above is significantly increased, the time for which each substrate must wait may be drastically lengthened.

Patent Document 1: TOKUKAI No. 2001-57336, KOHO (claims, paragraph [0046], and FIGS. 1 and 2)

Patent Document 2: TOKUKAIHEI No. 9-74127, KOHO (claims, paragraphs [0042] to [0043], and FIGS. 1 and 2)

However, in either of the apparatuses disclosed in the above Patent Documents, TOKUKAI No. 2001-57336, KOHO and TOKUKAIHEI No. 9-74127, KOHO, a plurality of (e.g., three or four) supporting pins are respectively provided at respective placing portions which are arranged into multiple stages or shelves for respectively storing a plurality of substrates, wherein each substrate is supported by using these supporting pins so as to carry each substrate to each substrate carrying apparatus. Accordingly, a particular height selected with consideration of transfer of the substrate relative to each substrate carrying apparatus must be provided in a space in which a sheet of substrate is stored in each substrate storing section, as such the number of the placing portions is limited by the height of the entire apparatus.

SUMMARY OF THE INVENTION

The present invention was made in light of the above circumstances, and it is therefore an object of this invention to provide a substrate carrying and processing apparatus which can achieve substantial downsizing of the apparatus, increase the number of substrates to be stored therein, and enhance the throughput.

To solve the above problem, the present invention provides a substrate carrying and processing apparatus, comprising: a carrier block which is adapted to position carriers each able to receive a plurality of substrates therein; a processing block including processing units each adapted to provide a proper process to each substrate which is taken out from one of the carriers; substrate carrying means which is adapted to transfer each substrate taken out from the carrier block to each processing unit in the processing block and configured such that it can be moved at least in the vertical direction and the horizontal direction; a substrate storing section which is provided between the carrier block and the processing block and able to store a plurality of substrates therein; and substrate transfer means which is able to transfer each substrate to and from the carrier block, adapted to transfer the substrate to the substrate storing section, and configured such that it can be moved at least in the vertical direction and the horizontal direction, wherein the substrate storing section has openings to which the substrate carrying means and the substrate transfer means can transfer each substrate along two directions crossing to each other, and includes a plurality of placing shelves arranged with a space relative to each other and supporting the bottom surface of the substrate, and wherein the substrate carrying means and substrate transfer means are configured such that they can be advanced into and retracted from the substrate storing section and such that they can be overlapped to the corresponding placing shelf in the vertical direction, when viewed in the horizontal direction.

The present invention is the substrate carrying and processing apparatus described above, wherein the space between each adjacent pair of the plurality of placing shelves is designed to be narrower than the thickness of each of the substrate carrying means and the substrate transfer means.

With such configuration, the substrate carrying means and the substrate transfer means can be advanced into and retracted from the substrate storing section through the openings provided along the two directions in the substrate storing section, and when advanced into the substrate storing section, each substrate can be transferred by vertical movement of the carrying or transfer means. In this case, by designing the space between each adjacent pair of the plurality of placing shelves to be narrower than the thickness of the of the substrate carrying means and the substrate transfer means, the entire space for storing substrates can be further reduced as much as possible.

The present invention is the substrate carrying and processing apparatus described above, wherein the processing block includes a coating film forming unit adapted to form a coating film comprising a resist film on a substrate, an antireflection film forming unit adapted to coat a chemical liquid for forming an antireflection film on the substrate, and a heating unit adapted to heat the substrate and wherein the substrate storing section includes a cooling plate adapted to cool the substrate.

The present invention is the substrate carrying and processing apparatus described above, wherein the processing block includes a coating film forming unit block, a first antireflection film forming unit block, and a second antireflection film forming unit block, which are arranged together into a stacked state, wherein the coating film forming unit block includes a coating film forming unit adapted to form a coating film, and a heating unit, the coating film forming unit and the heating unit being located in a horizontal transfer region of the substrate carrying means, wherein the first antireflection film forming unit block includes a first antireflection film forming unit adapted to form an antireflection film under the coating film, and a heating unit, the first antireflection film forming unit and the heating unit being located in a horizontal transfer region of the substrate carrying means, wherein the second antireflection film forming unit block includes a second antireflection film forming unit adapted to form an antireflection film over a coating film, and a heating unit, the second antireflection film forming unit and the heating unit being located in a horizontal transfer region of the substrate carrying means, and wherein the substrate storing section includes storing blocks, each including a plurality of placing shelves and a cooling plate provided in the storing blocks, and corresponding to the coating film forming unit block, the first antireflection film forming unit block and the second antireflection film forming unit block.

With such configuration, it becomes possible to have any substrate provided with an antireflection film under or over or on both sides of a resist film formed thereon, or otherwise not provided with any antireflection film and having the resist film alone, and to provide wait securely prior to a next process, so as to correspond with the type of the resist film to be coated on the substrate and the processing time in each processing unit to be used. Thus, each substrate can be cooled to a predetermined temperature in each substrate storing section.

The present invention is the substrate carrying and processing apparatus described above, wherein each placing shelf has a plate-like arm configured to extend into the substrate storing section from one side of the substrate storing section, wherein pins are provided to project from three points located concentrically at a distal end of each plate-like arm such that these pins support the substrate while providing a slight gap between the substrate and the surface of the plate-like arm, wherein a first pin of said pins is arranged in parallel with the direction, in which the substrate transfer means is advanced into the substrate storing section toward the center of the distal end of the plate-like arm, and wherein the substrate transfer means includes a horseshoe-shaped arm body including a pair of curved arm pieces, one of the curved arm pieces extending more distally than the other curved arm piece to an extent that it does not interfere with the second and third pins other than said first pin, and supporting nails for supporting the substrate are provided at three points, each located at distal lower portions of both the arm pieces and a proximal lower portion of the arm body.

With such configuration, the substrate carrying means can be advanced and retracted through the narrowest range to be defined by the three pins for supporting each substrate, thereby minimizing the shape of a substrate supporting portion of the substrate carrying means while stabilizing the support and conveyance of each substrate. On the other hand, the substrate transfer means can be advanced and retracted through the widest range to be defined by the three pins for supporting each substrate. The substrate transfer means includes a horseshoe-shaped arm body including a pair of curved arm pieces, one of the curved arm pieces extending more distally than the other curved arm piece to an extent that it does not interfere with the second and third pins other than said first pin. In addition, supporting nails for supporting each substrate are provided at three points, each located at distal lower portions of both the arm pieces and a proximal lower portion of the arm body of each substrate transfer means, as such each substrate can be supported and carried in a stable state without unduly enlarging the shape of the substrate supporting portion of each substrate transfer means.

The present invention is the substrate carrying and processing apparatus described above, wherein each placing shelf has a plate-like arm configured to extend into each substrate storing section from one side of the substrate storing section, each plate-like arm being placed on another adjacent one and detachably connected and secured thereto, via a spacer and using a connecting means, creating a stacked state.

With such configuration, the number of the placing shelves can be optionally decreased and increased.

The present invention is the substrate carrying and processing apparatus described above, further comprising a substrate sensor provided to the placing shelf of each substrate storing section and adapted to detect presence or absence of the substrate, and a control means being adapted to control the operation of the substrate carrying means for carrying the substrate to the substrate storing section, on a signal from the substrate sensor.

With such configuration, by detecting presence or absence of a substrate on each placing shelf in the substrate storing section by using the substrate sensor, and by transmitting a detection signal to the control means, the control means can recognize the presence or absence of the substrate on each placing shelf. Consequently, the transfer (conveyance) of each substrate to each placing shelf on which the substrate is not placed can be performed, based on a control signal from the control means.

Since the substrate carrying and processing apparatus of the present invention is configured as described above, it can provide effects as listed below.

(1) According to the present invention, since the substrate carrying means or the substrate transfer means can be advanced into and retracted from the substrate storing section through the openings provided along the two directions in the substrate storing section, and after advancing into the substrate storing section, the transfer of the substrate can be performed by vertical movement the each carrying or transfer means, the space for storing substrates in the substrate storing section can be reduced as much as possible, thus downsizing the apparatus, increasing the number of substrates to be stored therein, and hence enhancing the throughput. In this case, by designing the space between each adjacent pair of the plurality of placing shelves to be narrower than the thickness of the substrate carrying means and the substrate transfer means, the space provided for storing substrates can be further reduced as much as possible.

(2) According to the present invention, since it becomes possible to have any substrate, provided with an antireflection film under or over or on both sides of a resist film formed thereon, or otherwise not provided with any antireflection film and having the resist film alone, wait securely prior to a next process, so as to correspond with the type of the resist film to be coated on the substrate and the processing time in each processing unit to be used, complicated processes, which can correspond to the type of the resist film to be coated on the substrate and the processing time in each processing unit, can be performed with high efficiency.

(3) According to the present invention, the shape of the substrate supporting portion of the substrate carrying means can be minimized, while support and conveyance of each substrate can be significantly stabilized. Furthermore, the support and conveyance of each substrate can be stabilized without unduly enlarging the shape of the substrate supporting portion of each substrate transfer means. Thus, without further enlarging the substrate carrying means and the substrate transfer means, the support and conveyance of each substrate can be carried out in a stable state.

(4) According to the present invention, since the number of the placing shelves can be optionally decreased and increased, the number of the placing shelves in the substrate storing section can be readily changed in response to alteration of the substrate carrying schedule and the processing time.

(5) According to the present invention, by detecting presence or absence of a substrate on each placing shelf in the substrate storing section by using the substrate sensor, and by transmitting a detection signal to the control means, the control means can recognize the presence or absence of a substrate on each placing shelf. In this way, the transfer (conveyance) of each substrate to each placing shelf on which the substrate is not placed can be performed, based on a control signal given from the control means. Therefore, the transfer of a substrate to each substrate storing section can be ensured, thereby enhancing the throughput.

BRIEF DESCRIPTION OF THE DRAWINGS

FIG. 5 is a schematic side view showing a substrate storing section and a substrate transfer means of the present invention.

FIG. 7 is a partly exploded perspective view showing a placing shelf and a cooling plate of the present invention.

DETAILED DESCRIPTION OF THE INVENTION

EXAMPLES

Hereinafter, one example which is considered to be the most preferred embodiment of the present invention will be described with reference to the attached drawings. In the description, a case where a substrate carrying and processing apparatus according to the present invention is applied to a resist coating and developing apparatus utilized for semiconductor wafers is discussed.

Figure 1:
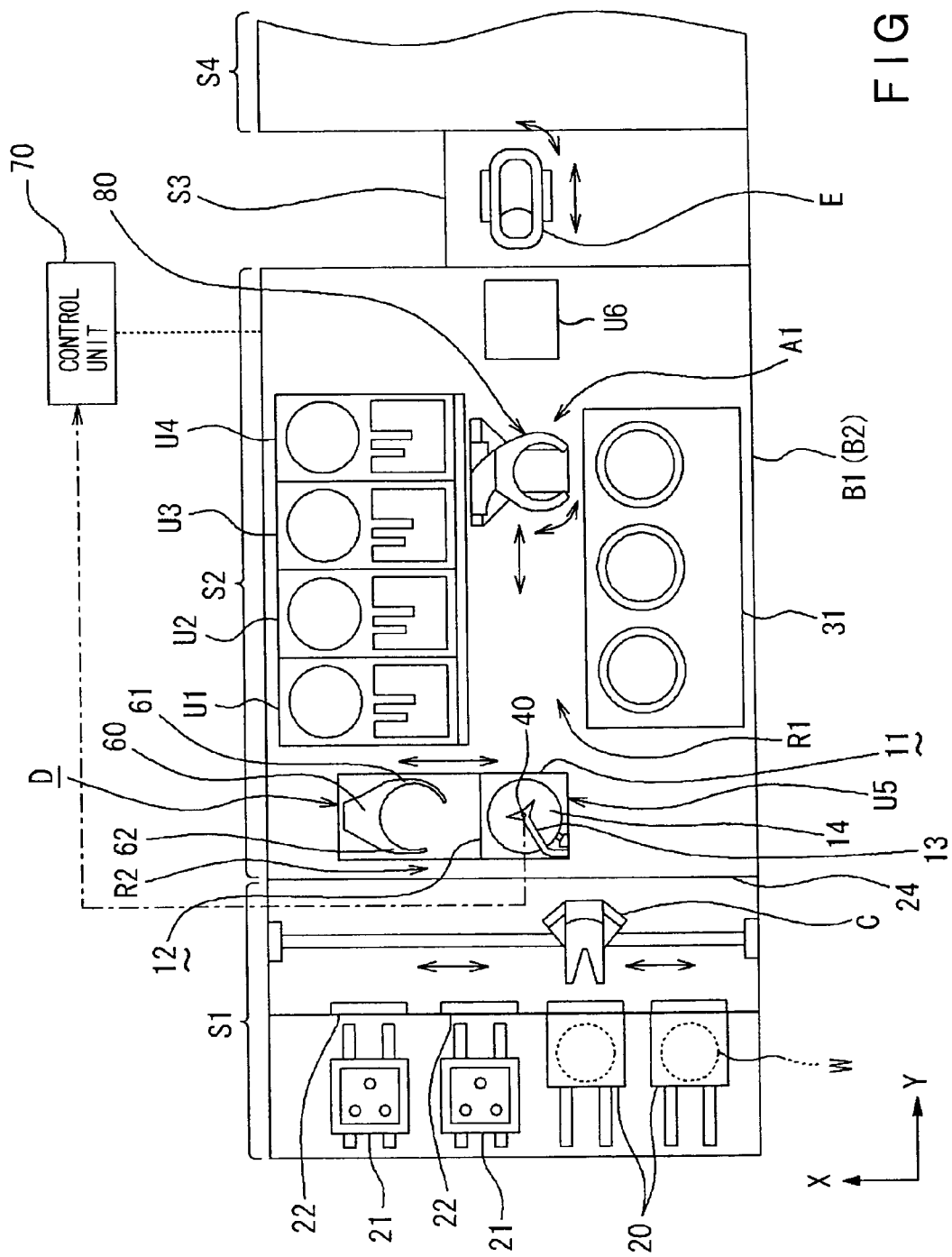
FIG. 1 is a schematic plan view showing one example of a resist coating and developing apparatus to which a substrate carrying and processing apparatus according to the present invention is applied.
Figure 2:
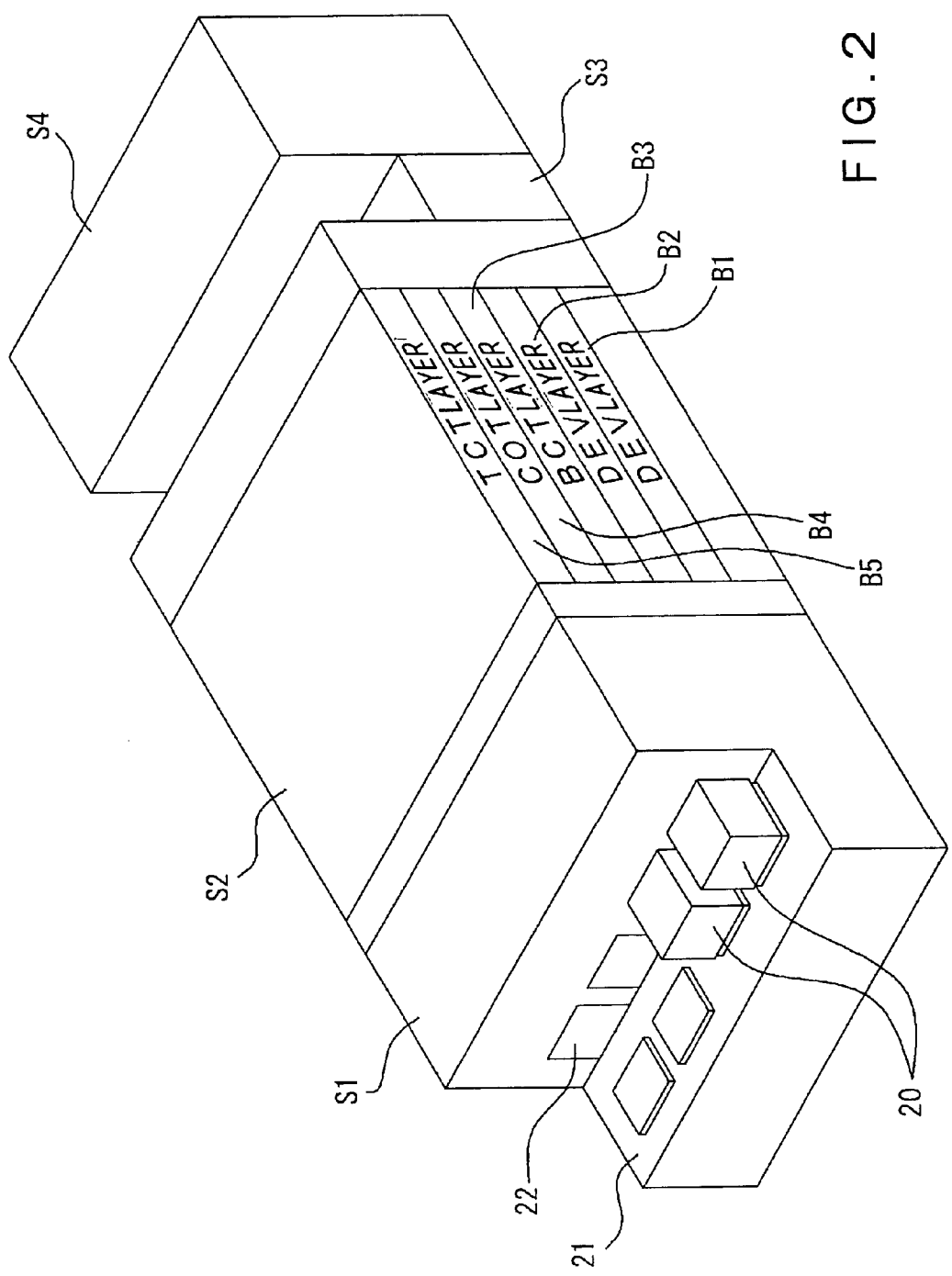
FIG. 2 is a schematic perspective view of the resist coating and developing apparatus.
Figure 3:
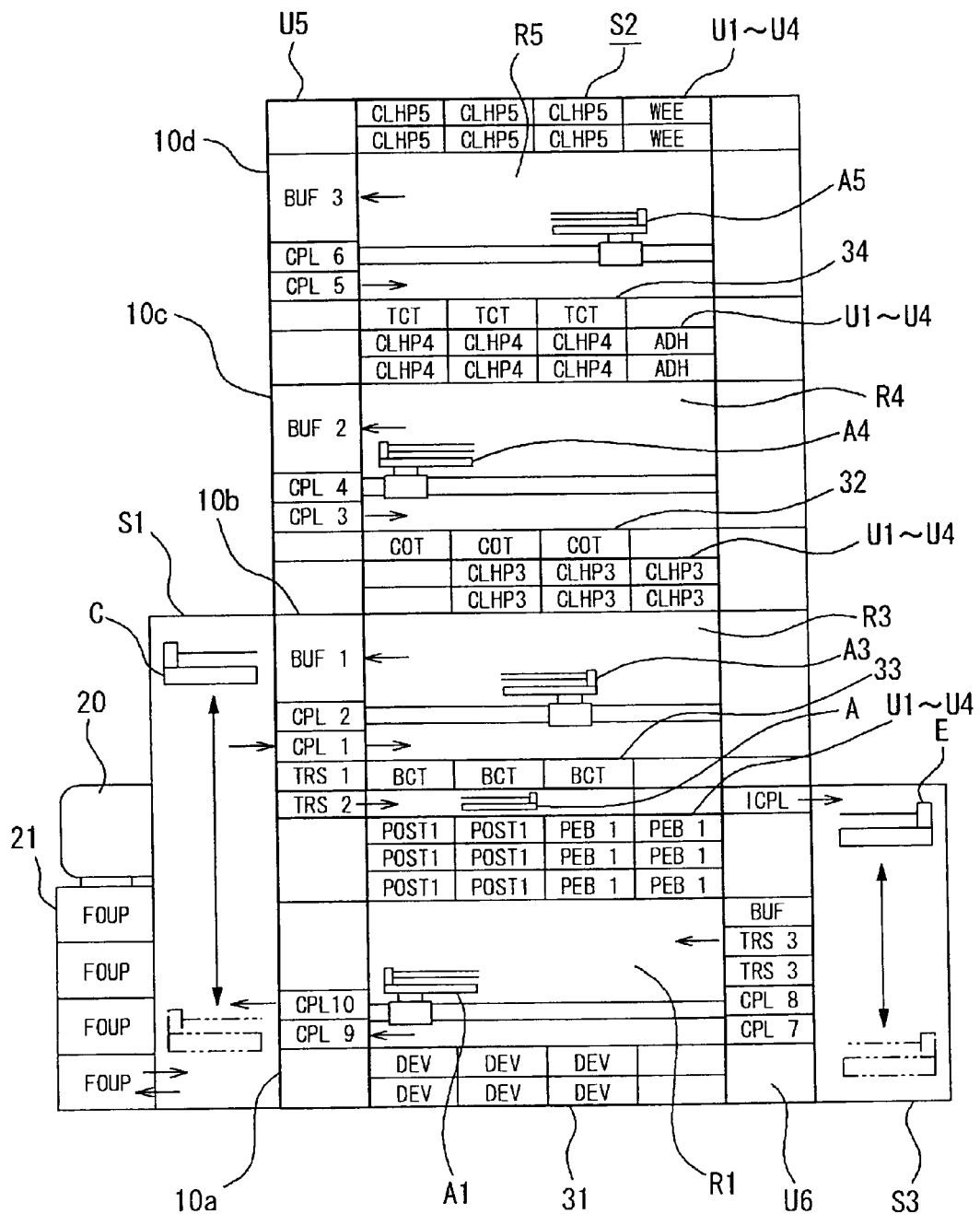
FIG. 3 is a schematic view of the resist coating and developing apparatus illustrating a general configuration of unit blocks of a processing section, the unit blocks being expressed in a stacked state.

FIG. 1 is a schematic plan view showing one example of the resist coating and developing apparatus, FIG. 2 is a schematic perspective view of the same apparatus, and FIG. 3 is a schematic view of the same apparatus, illustrating a general configuration of unit blocks of a processing section, the unit blocks being expressed in a plan view and in a stacked state.

The resist coating and developing apparatus comprises a carrier block S1 which is configured to carry in and carry out carriers 20 each receiving thirteen sheets, for example, of semiconductor wafers W (hereinafter, referred to as wafers W), as a substrate, in a closed state, and a processing block S2 configured by vertically arranging a plurality of, for example, five, unit blocks B1 to B5, an interface block S3, and an exposure apparatus S4.

The carrier block S1 includes a table 21 on which a plurality of (e.g., four) carriers 20 can be placed, an opening and closing section 22 provided in a front wall of the table 20, and a transfer arm C adapted to take out each wafer W from each carrier 20 via the opening and closing section 22. The transfer arm C can be moved in both the horizontal X and Y directions as well as in the vertical Z direction and can also be rotated about the vertical axis, such that it can transfer each wafer W to respective transfer stages TRS1, TRS2, which are provided in a rack unit U5 constituting each substrate storing section described below.

On the back side of the carrier block S1, the processing block S2 which is surrounded by a housing 24 is located and connected with the carrier block S1. The processing unit S2, in this example, includes, as shown in FIG. 2, first and second unit blocks (DEV layers) B1, B2 comprising the lower two stages and each adapted to carry out a developing process, a third unit block (BCT layer) B3 which serves as a first antireflection film forming unit block adapted to form an antireflection film (hereinafter, referred to as "a first antireflection film") to be provided under a resist film, a fourth unit block (COT layer) B4 which serves as a coating film forming unit block adapted to coat a resist liquid, and a fifth unit block (TCT layer) B5 which serves as a second antireflection film forming unit block adapted to form an antireflection film (hereinafter, referred to as "a second antireflection film") to be provided over a resist film. In this case, the DEV layers B1, B2 correspond to unit blocks provided for the developing process, and the BCT layer B3, COT layer B4 and TCT layer B5 correspond to unit blocks for the coating film forming, respectively.

Next, each configuration of the first to fifth unit blocks B (B1 to B5) will be described. Each of these unit blocks B1 to B5 includes liquid processing units each disposed on the front face side and adapted to coat each wafer W with a chemical liquid, and processing units, such as various heating units, each disposed on the back face side and adapted to perform a pre-treatment and a post-treatment for the process to be carried out in the liquid processing unit. Between the respective liquid processing units disposed on the front face side and the respective processing units, such as heating units, disposed on the back face side, each wafer W is transferred via main arms A1, A3 to A5, each of which is used as an exclusive substrate carrying means.

In this example, the unit blocks B1 to B5 are configured to have the same layout concerning liquid processing units, other processing units, such as heating units, and the carrying means. By the same layout, it is meant that the center on which each wafer W is placed in each processing unit, that is, the center of a spin chuck which serves as a holding means for each wafer W in the liquid processing unit and the center of a heating plate and of a cooling plate in the heating unit are the same.

The DEV layers B1, B2 are configured similarly to each other. As shown in FIG. 1, a carrying region R1 (a horizontal transfer region for the main arm A1) for each wafer W is provided, at an approximately central level of the DEV layers B1, B2, extending in the direction along the length of DEV layers B1, B2 (Y direction in the drawing), such that the region R1 connects the carrier block S1 with the interface block S3.

Along the carrying region R1, a plurality of developing units 31 are provided to comprise two stages, for example, on the right side when viewed from the carrier block S1, i.e., from the front side (the side of carrier block S1) to the back side, wherein each developing unit 31 includes a plurality of developing sections each adapted for performing a developing process and constitutes the liquid processing unit. In the respective unit blocks B1, B2 four rack units U1, U2, U3, U4, for example, are provided, in succession, from the front side to the back side, wherein each rack unit is configured by arranging heating units into a multi-stage form. In the drawing, each of the rack units U1 to U4 adapted to carry out a pre-treatment and/or post-treatment for the treatment to be performed in each developing unit 31 is configured to have a multi-stage, for example, three-stage, structure. In such a manner, the developing units 31 and the rack units U1 to U4 are divided from one another, and floating of particles in the carrying region R1 can be controlled by ejecting and discharging cleaning air in the carrying region R1.

Figure 4:
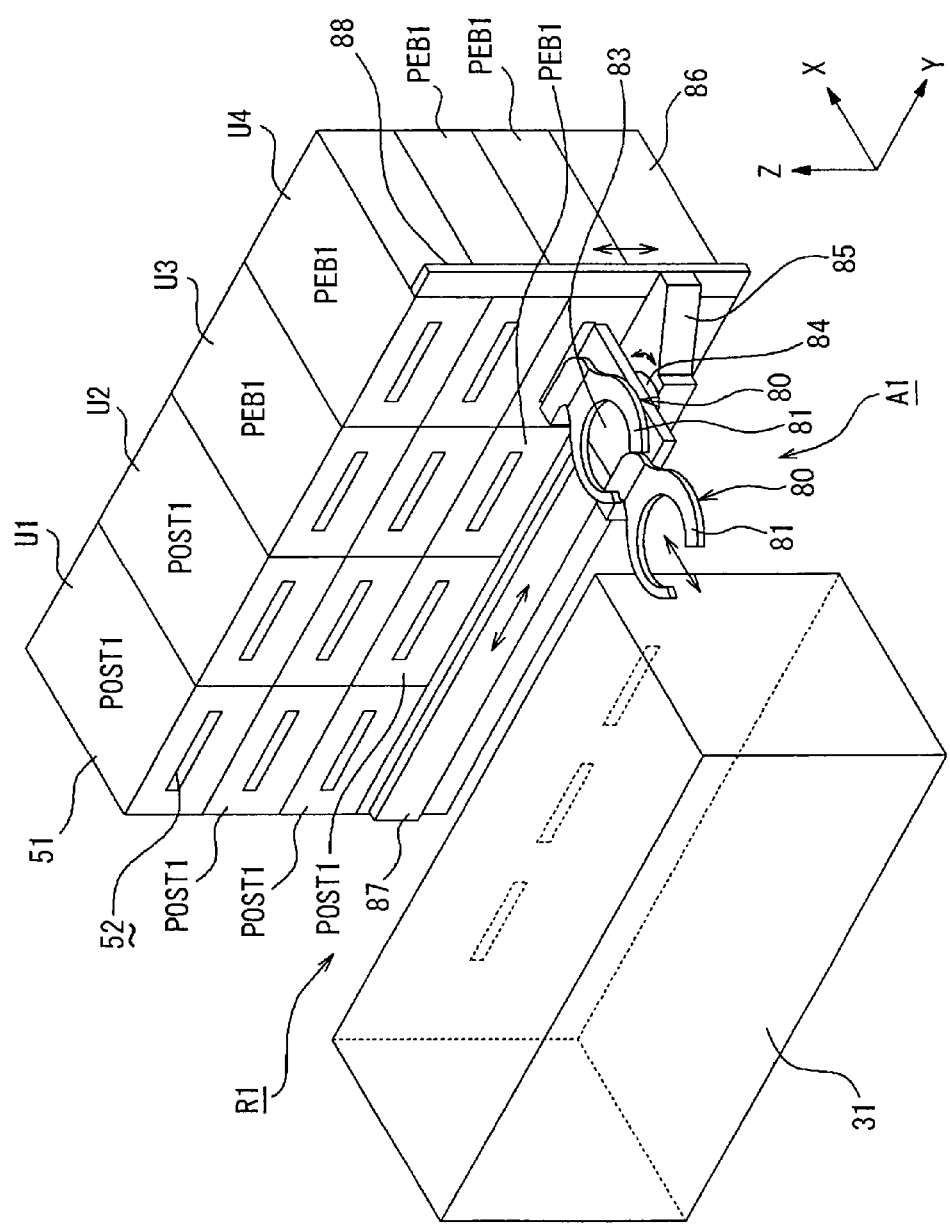
FIG. 4 is a schematic perspective view showing a unit block (DEV layer) of a processing block of the present invention.

In each of the units described above for performing a pre-treatment and/or post-treatment, for example, as shown in FIG. 4, heating units (PEB1) also referred to as post-exposure baking units, each adapted to heat each wafer after subjected to an exposure process, and other heating units (POST1) also referred to as post-baking units, each adapted to perform a heating process to vaporize moisture on each wafer W after the developing process, and the like, are included. These processing units, such as the heating units (PEB1, POST1), are respectively housed in a processing container 51, and each of the rack units U1 to U4 includes three processing containers 51 arranged vertically in a stacked state. In the face opposed to the carrying region R1 of each processing container 51, a wafer transfer port 52 is formed.

In the transfer region R1, the main arm A1 described above is provided. The main arm A1 is adapted to transfer a wafer between all of the modules in the DEV layer B1 (places on which the wafer is to be placed), for example, the respective processing units in the rack units U1 to U4, developing units 31, and rack unit U5. Therefore, the main arm A1 is configured such that it can be moved in both the horizontal X and Y directions as well as in the vertical Z direction and can also be rotated about the vertical axis.

The unit blocks B3 to B5 each adapted for forming a coating film is configured similarly to one another, and is also configured similarly to the unit blocks B1, B2 used for the developing process described above. Specifically, the COT layer B4 will be described as a typical example with reference to FIGS. 3, 13 and 14. The COT layer B4 includes a coating unit 32 which serves as the liquid processing unit and is adapted to provide a coating process of a resist liquid onto each wafer W. Each of the rack units U1 to U4 of the COT layer B4 includes a heating unit (CLHP4) adapted to heat each wafer W after subjected to the resist liquid coating process and a hydrophobicity rendering unit (ADH) which is to be provided for enhancing adhesion properties between the resist liquid and the wafer W, and these rack units U1 to U4 are configured similarly to the DEV layers B1, B2. Namely, the coating unit 32, heating unit (CLHP4) and hydrophobicity rendering unit (ADH) is separated from one another by a carrying region R4 of the main arm A4 (a horizontal transfer region for the main arm A4). In the COT layer B4, each wafer W is carried to a placing shelf BUF2 of a third storing block 10c of the rack unit U5, cooling plate CPL3 (CPL4), coating unit 32, and each processing unit of the rack units U1 to U4, by the main arm A4. It is noted that the hydrophobicity rendering unit (ADH) is configured to perform a gas treatment in an atmosphere consisting of HMDS and that it may be provided in any of the unit blocks B3 to B5 for forming a coating film.

The BCT layer B3 includes a first antireflection film forming unit 33 which serves as the liquid processing unit and is adapted to form a first antireflection film for each wafer W. Each of the rack units U1 to U4 of the BCT layer B3 includes a heating unit (CLHP3) adapted to heat each wafer W after subjected to the antireflection film forming process, and these rack units U1 to U4 are configured similarly to those of the COT layer B4. Namely, the first antireflection film forming unit 33 and each heating unit (CLHP3) are separated by a carrying region R3 of the main arm A3 (a horizontal transfer region for the main arm A3). In the third unit block B3, each wafer W is carried to a placing shelf BUF1 of a second storing block 10b of the rack unit U5, cooling plate CPL1 (CPL2), first antireflection film forming unit 33, and each processing unit of the rack units U1 to U4, by the main arm A3.

The TCT layer B5 includes a second antireflection film forming unit 34 which serves as the liquid processing unit and is adapted to form a second antireflection film for each wafer W. Each of the rack units U1 to U4 of the TCT layer B5 includes a heating unit (CLPH5) adapted to heat each wafer W after subjected to the antireflection film forming process and a periphery exposure unit (WEE), and except these points, the rack units U1 to U4 are configured similarly to those of the COT layer B4. Namely, the second antireflection film forming unit 34, heating unit (CLHP5) and periphery exposure unit (WEE) are separated by a carrying region R5 of the main arm A5 (a horizontal transfer region for the main arm A5). In the TCT layer B5, each wafer W is carried to a placing shelf BUF3 of a fourth storing block 10d of the rack unit U5, cooling plate CPL5 (CPL6), second antireflection film forming unit 34, and each processing unit of the rack units U1 to U4 by the main arm A5.

In the processing block S2, a shuttle arm A, which is a substrate carrying means adapted to transfer each wafer W between a transfer stage TRS2 provided in the rack unit U5 and a rack unit U6 located on the side of the interface block S3, is provided such that it can be moved in the horizontal Y direction as well as driven in the vertical Z direction.

The carrying region of the shuttle arm A and the carrying regions R1, R3 to R5 of the main arms A1, A3 to A5 are partitioned, respectively.

A region defined between the processing block S2 and the carrier block S1 serves as a transfer region R2 for each wafer W, in which the rack unit U5 is provided, as a substrate storing section, at a position to which the transfer arm C, main arms A1, A3 to A5, and shuttle arm A can access, respectively. Additionally, a transfer arm D, which serves as a substrate transfer means adapted to transfer each wafer W to the rack unit U5, is provided. In this case, the rack unit U5 is located on the axis of the horizontal transfer direction (Y direction) of the main arms A1, A3 to A5, and shuttle arm A. The rack unit U5 has a first opening 11 in the advancing and retracting direction (Y direction) of the main arms A1, A3 to A5, and shuttle arm A, and a second opening 12 in the advancing and retracting direction (X direction) of the transfer arm D.

Figure 6:
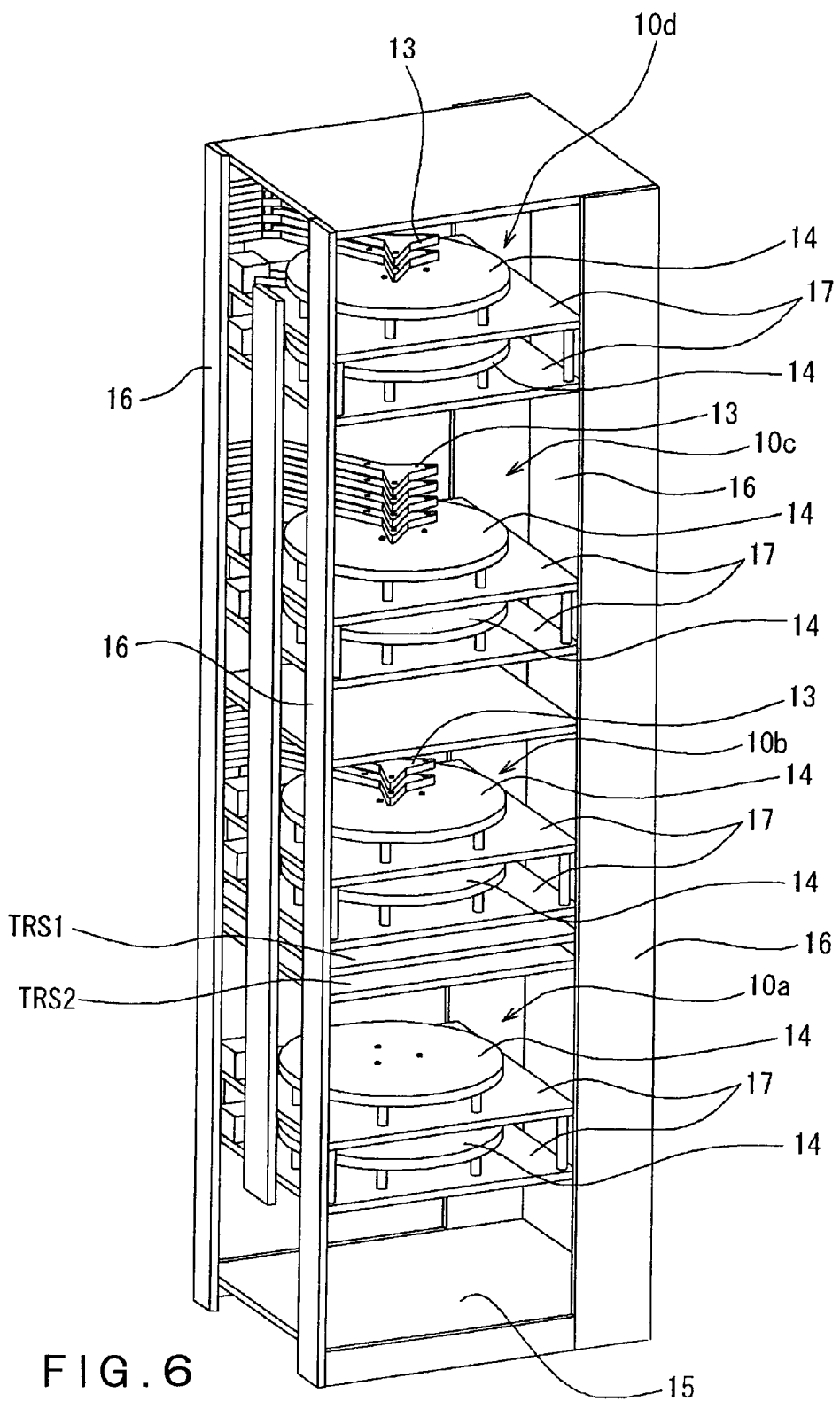
FIG. 6 is a schematic perspective view showing the substrate storing section.

The rack unit U5 includes, as shown in FIGS. 3, 5 and 6, two transfer stages TR1, TRS2, for example, such that it can transfer each wafer W to the main arms A1, A3 to A5, and shuttle arm A of the unit blocks B1 to B5, respectively. The rack unit U5 also includes storing blocks 10a to 10d, which are divided in a number of sections to correspond with the respective unit blocks B1 to B5. In each of the storing blocks 10a to 10d, cooling plates 14 (CPL1 to CPL6) are provided, for adjusting multiple placing shelves 13 and each wafer W prior to the coating process at a predetermined temperature, adjusting each wafer W at a predetermined temperature prior to the antireflection film forming process, and adjusting each wafer W, which has been subjected to the heating process, at a predetermined temperature after the exposure process.

In this case, the first storing block 10a corresponds to the first and second unit blocks B1 and B2 (DEV layer), the second storing block 10b corresponds to the third unit block B3 (BCT layer), the third storing block 10c corresponds to the fourth unit block B4 (COT layer), and the fourth storing block 10d corresponds to the fifth unit block B5 (TCT layer). Each cooling plate (CPL1 to CPL6) is placed, as shown in FIG. 6, on each holding plate 17 supported by four posts 16 which are respectively raised upward from a rectangular base plate 15. While each cooling plate 14 (CPL1 to CPL6) is of a water-cooling type in which cooling water of a constant temperature is circulated through a refrigerant passage provided therein, other types than the water-cooling type may also be used.

Each placing shelf 13 includes a plate-like arms 13a, each of which is configured to extend into the rack unit U5 from one side thereof. In this case, each plate-like arm 13a includes a furcated portion 13b, which is furcated at an angle of about 120°, for example, at its distal end. In addition, proximity pins 18a, 18b, 18c are projected from three points located concentrically at a distal end of each plate-like arm 13a including the furcated portion 13b such that these pins support a wafer W while providing a slight gap of approximately 0.5 mm, for example, between the wafer W and the surface of the plate-like arm 13a. Among the proximity pins 18a, 18b, 18c, the first pin 18a is positioned to be parallel with the direction, in which direction the transfer arm D will be advanced into the rack unit U5 toward the center of the distal end of the plate-like arm 13a.

As stated above, a case in which the plate-like arm 13a of each placing shelf 13 includes the furcated portion 13b has been described, but any suitable shape of the plate-like arm 13a, for example, a circular shape, may be applied, provided that neither an arm body 60 of the transfer arm D into the rack unit U5 from its second opening 12 nor an arm body 80 of the main arm into the rack unit U5 from its first opening 11 will interfere with the plate-like arm 13a.

Each plate-like arm 13a is attached, at its one end, to one of the posts 16 of the rack unit U5 such that it can be extended into the rack unit U5 from one side. The proximal end of one plate-like arm 13a is detachably connected and secured to the proximal end of another plate-like arm 13a, via a spacer 19a, into a stacked state, by using suitable connecting means, for example, connecting bolts 19b (see FIG. 7). In such a way, by connecting plate-like arms 13a, which constitute each placing shelf 13, detachably into a stacked state, by using connecting bolts 19b, the number of the stages of each placing shelf 13, i.e., the number of the plate-like arms 13a can be readily reduced or increased, corresponding to the processing schedule or processing time.

As shown in FIG. 5, the rack unit U5 is configured such that a predetermined flow rate of cleaning gas can be supplied into the rack unit U5 from the side of the carrier block S1 of the rack unit U5.

Figure 12:
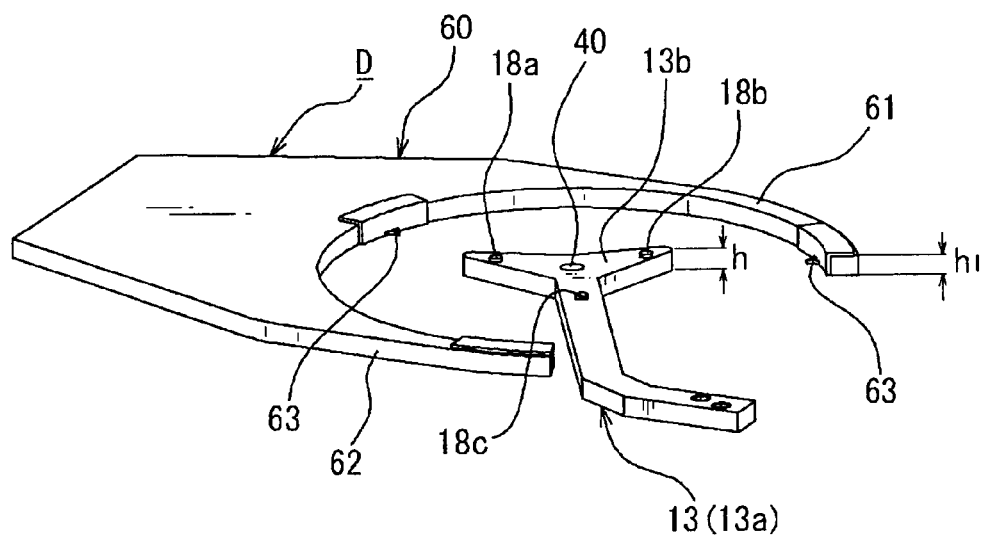
FIG. 12 is a perspective cross section of FIG. 10.

The transfer arm D has the arm body 60 including a pair of curved arm pieces 61, 62, wherein the arm body 60 is horseshoe-shaped, and one curved arm piece 61 extends more distally than the other curved arm 62 to an extent that it does not interfere with the second pin 18b or the third pin 18c other than the first pin 18a. Supporting nails 63 for supporting each wafer W are provided at three points, each located at distal lower portions of both the arm pieces 61, 62 and a proximal lower portion of the arm body 60. The thickness h1 of the arm body 60 and the thickness h of each plate-like arm 13a are designed to be substantially the same, so that once the transfer arm D is advanced into the rack unit U5, the arm body 60 is overlapped to the plate-like arm 13a in the vertical direction, when viewed in the horizontal direction (see FIG. 12).

In this case, the state in which the arm body 60 is overlapped to the plate-like arm 13a in the vertical direction also includes even a state in which the plate-like arm 13a is partly overlapped to the arm body 60.

By designing the thickness h1 of the arm body 60 and the thickness h of the placing shelf 13 or plate-like arm 13a to be substantially the same, a minimal space can be obtained between adjacent two placing shelves 13, which makes it possible that the arm body 60 of the transfer arm D is moved in the vertical direction in the space and the wafer W is transferred between the arm body 60 and the proximity pins 18a, 18b, 18c of the corresponding placing shelf 13. Therefore, the number of the placing shelves 13 can be increased in a limited space. By forming the transfer arm D to be horseshoe-shaped, in which one curved arm piece 61 extends more distally than the other curved arm 62 to an extent that it does not interfere with the second proximity pin 18b or the third proximity pin 18c of the three proximity pins 18a, 18b, 18c provided in each placing shelf 13, the proximity pins 18b and 18c constituting the widest range in the direction perpendicular to the advancing direction of the transfer arm D, the wafer W can be carried while being supported in a stable state without unduly enlarging the arm body 60 of the transfer arm D.

Figure 8:
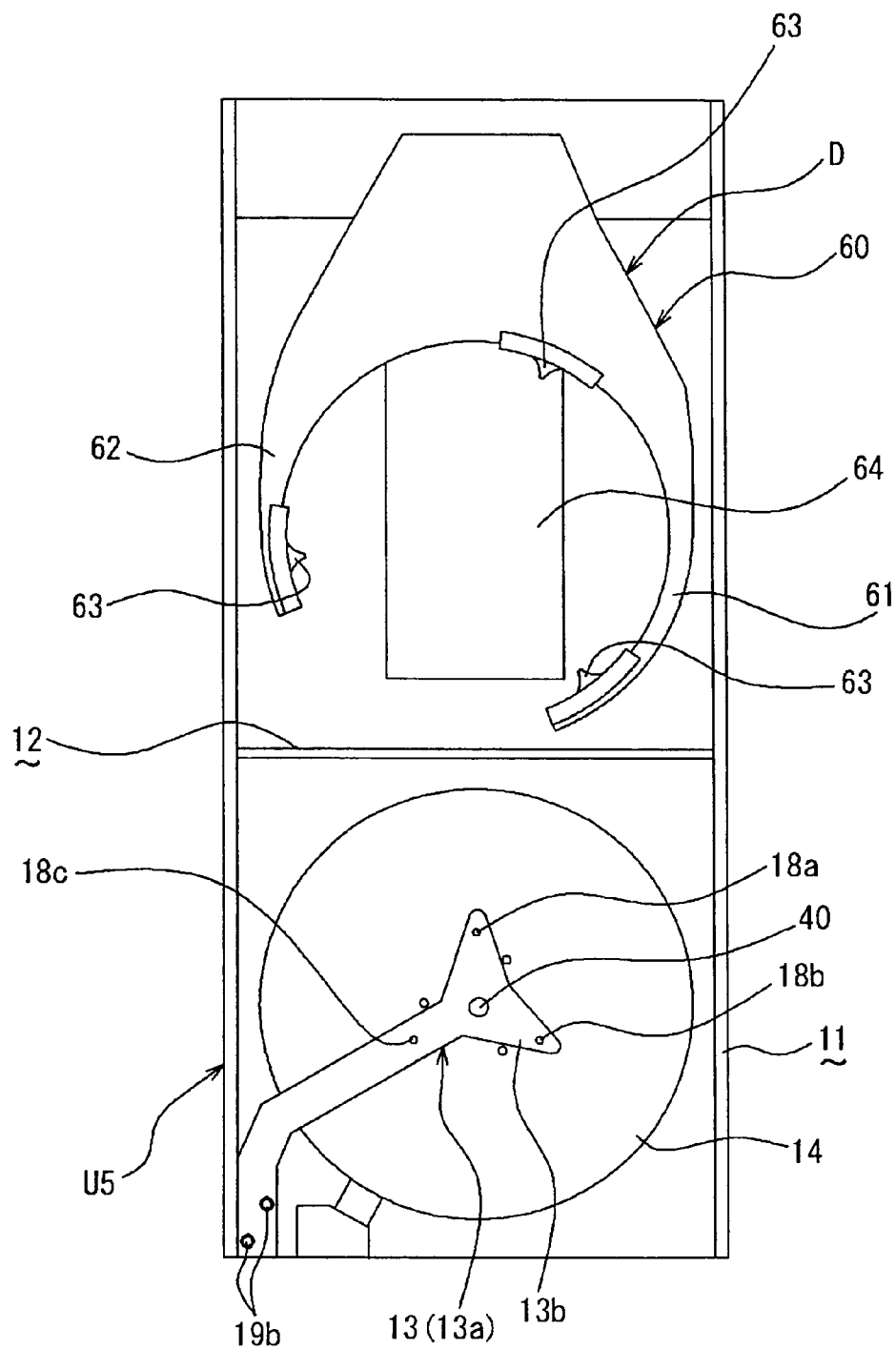
FIG. 8 is a schematic plan view showing a placing shelf and a substrate transfer means of the present invention.

The transfer arm D is configured such that the arm body 60 including the curved arm pieces 61, 62 and supporting nails 63 can be advanced into and retracted from the rack unit 5 along a base 64, as shown in FIG. 8. The base 64 is configured such that it can be moved by a driving mechanism in the Z direction along a Z axis rail attached to a face facing the second opening 12, of the base plate 15 for supporting the rack unit U5. In this way, the arm body 60 is configured such that it can be advanced and retracted in the X direction as well as can be moved in the vertical direction so that it can transfer each wafer W to each storing block 10a to 10d of the rack unit U5 and transfer stages TR1, TR2. The drive of the transfer arm D is controlled by a controller (not shown) based on an instruction from a control unit 70 described below.

Figure 9:
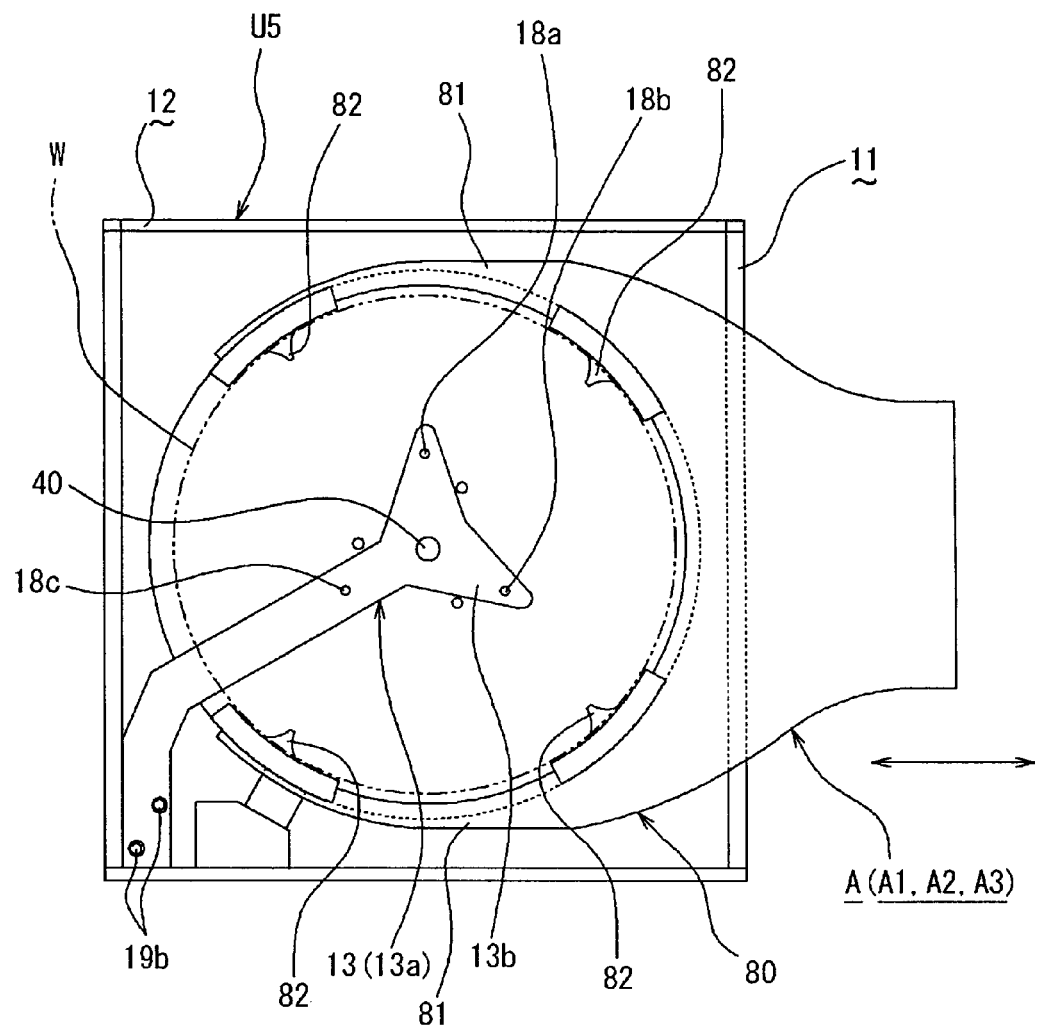
FIG. 9 is a schematic plan view illustrating a state of transferring a wafer between the substrate carrying means and the placing shelf.
Figure 10:
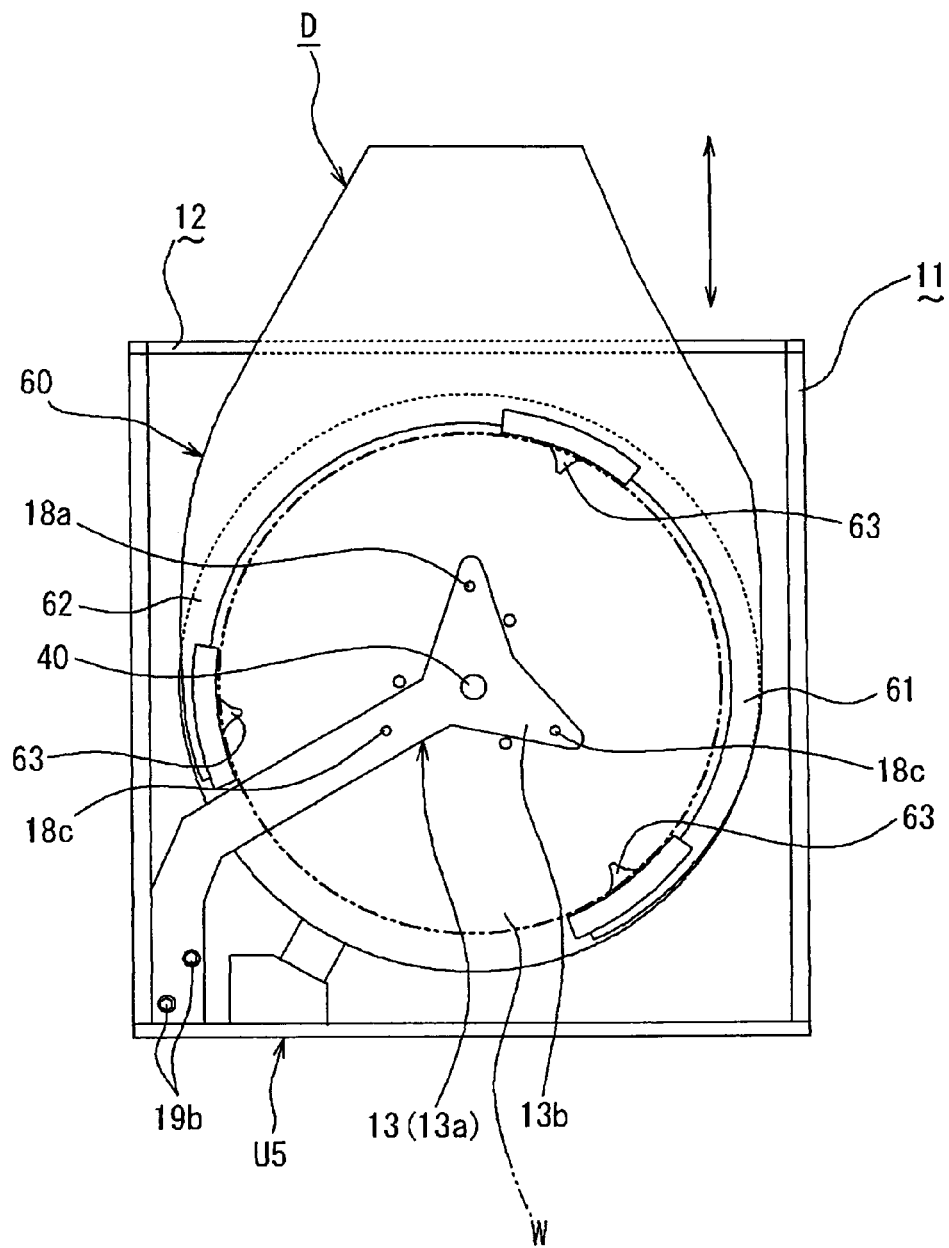
FIG. 10 another schematic plan view illustrating a state of transferring a wafer between the substrate transfer means and the placing shelf.
Figure 11:
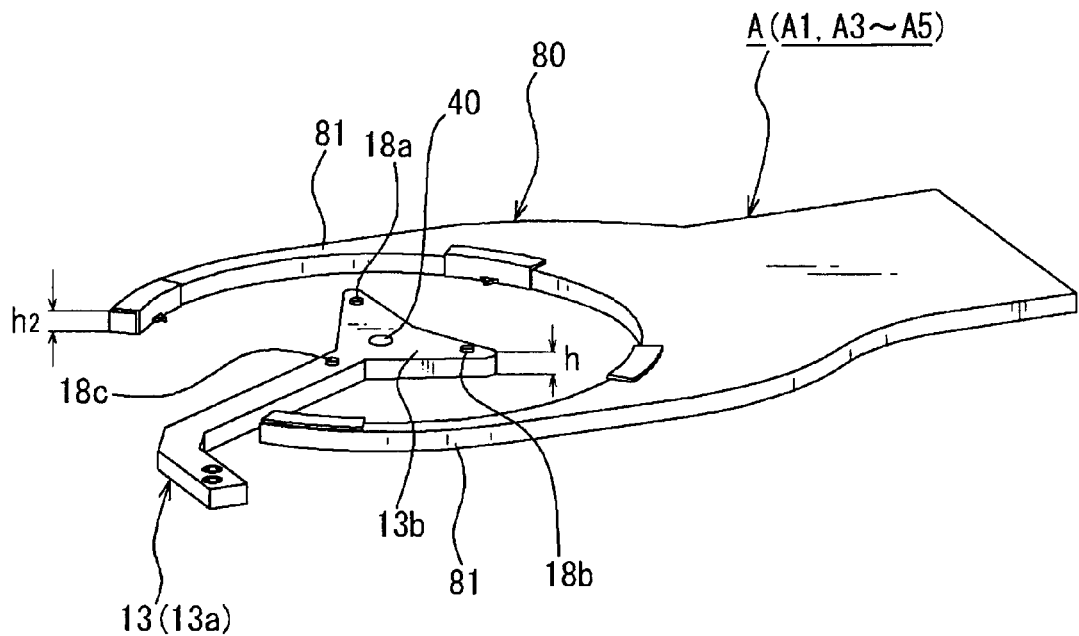
FIG. 11 is a perspective cross section of FIG. 9.

Since the main arms A1, A3 to A5 and the shuttle arm A are generally configured in the same manner, only the shuttle arm A is now described as a typical example thereof. As shown in FIG. 9, the shuttle arm A includes an arm body 80 which is horseshoe-shaped and includes a pair of curved arm pieces 81 either of which does not interfere with the proximity pin positioned on the side of the narrowest range defined by the three proximity pins 18a, 18b, 18c. Supporting pins 82 for supporting each wafer W are provided at four points of distal lower portions and proximal lower portions of the respective curved arm pieces 81. In addition, the thickness h2 of the arm body 80 and the thickness h of each plate-like arm 13a are designed to be substantially the same, as in the case of the transfer arm D, so that, once the shuttle arm A is advanced into the rack unit U5, the arm body 80 is overlapped to the plate-like arm 13a in the vertical direction, when viewed in the horizontal direction (see FIG. 11).

In this case, the state in which the arm body 80 is overlapped to the plate-like arm 13a in the vertical direction also includes even a state in which the plate-like arm 13a is partly overlapped to the arm body 80.

Accordingly, as with the case of the transfer arm D, a minimal space can be obtained between adjacent two placing shelves 13, which makes it possible that the arm body 80 of the shuttle arm A is moved in the vertical direction in the space and the wafer W is transferred between the arm body 80 and the proximity pins 18a, 18b, 18c of the corresponding placing shelf 13. Therefore, the number of the placing shelves 13 can be increased in a limited space. Since the shuttle arm A includes four supporting nails 82 at four points of the arm body 80 which is horseshoe-shaped, each wafer W can be carried while being supported in a stable state.

The space between each adjacent pair of the plurality of placing shelves 13 is designed to be narrower than the thickness h1 of the arm body 60 of the transfer arm D as well as than the thickness h2 of the arm body 80 of the shuttle arm A. Thus, the space in the rack unit U5 for storing wafers can be reduced as much as possible, and it is also possible to increase the number of sheets of wafers W to be stored in the rack unit U5 as well as to downsize the apparatus when the number of sheets of wafers W is relatively small.

Because the main arms A1, A3 to A5 are generally configured in the same manner, only the main arm A1 is now described as a typical example thereof. For example, as shown in FIG. 4, the arm body 80 having two curved arm pieces 81 is provided for supporting a peripheral region of the back side of each wafer W, wherein the curved arm pieces 81 can be advanced and retracted independently along a base 83. The base 83 is configured such that it can be rotated about the vertical axis by a rotating mechanism 84, and can be moved in the Y direction along a Y axis rail 87 attached to a face facing the carrying region R1, of a base 86 for supporting the rack units U1 to U4, due to a driving mechanism 85, as well as can be moved in the vertical direction along a lifting rail 88. In this way, the curved arm pieces 81 can be advanced and retracted in the X direction, moved in the Y direction, and lifted along and rotated about the vertical axis, so that it can transfer each wafer to each unit of the rack units U1 to U6, transfer stage TRS3 and the liquid processing unit. The drive of the main arm A1 is controlled by a controller (not shown) based on an instruction of the control unit 70. In order to prevent accumulation of heat of the main arm A1 (A3 to A5) in each heating unit, the order of transferring each wafer W can be optionally controlled in accordance with a program.

In a region of the processing block S2 adjacent to the interface block S3, as shown in FIGS. 1 and 3, the rack unit U6 is provided in a position where both the main arm A1 and shuttle arm A can access. As shown in FIG. 3, the rack unit U6 is configured such that it transfers each wafer W to the main arm A1 of each DEV layer B1, B2. In this example, each DEV layer B1, B2 includes two transfer stages TRS3 and a transfer stage ICPL which is adapted to transfer each wafer W to the shuttle arm A and has a cooling function.

Figure 13:
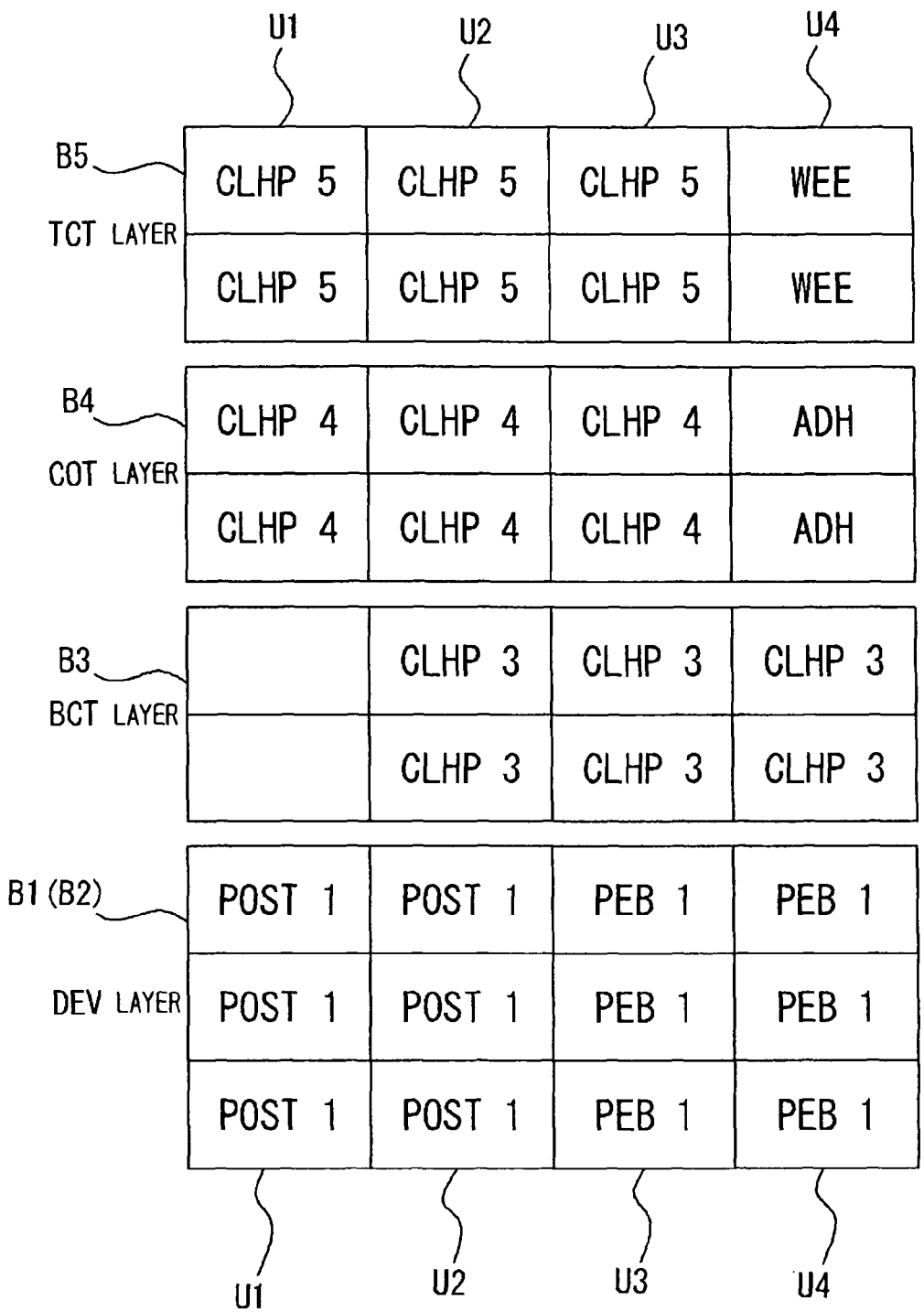
FIG. 13 is a schematic cross section showing one example of processing units of a processing block of the present invention.

FIG. 13 shows one example of the layout of processing units, which layout is provided only for convenience. Namely, the processing units are not limited to heating units (CLHP, PEB, POST), hydrophobicity rendering units (ADH), periphery exposure unit (WEE), but other processing units may be provided alternatively or in addition to those units. In an actual system, the number of units to be installed is determined depending on the processing time of each processing unit or the like.

On the back side of the rack unit 6 in the processing block 2, the exposure apparatus S4 is provided and connected via the interface block S3. In the interface block S3, an interface arm E is provided, which is adapted to transfer each wafer W to each section of the DEV layers B1, B2 in the processing block S2 and the rack unit U6 as well as to the exposure apparatus S4. The interface arm E serves as a carrying means for each wafer W to be carried between the processing block S2 and the exposure apparatus S4, and in this example, it is configured such that it can be moved in both the X and Y directions as well as in the Z direction and can be rotated about the vertical axis, so as to transfer each wafer W to the transfer stages TRS3, ICPL of the DEV layers B1, B2.

In the resist coating and developing apparatus configured as described above, each wafer W can be carried freely via the transfer stages TRS1, TRS2 by using the aforementioned transfer arm D between the respective unit blocks B1 to B5 which are stacked into a five-stage form. In addition, due to the interface arm E described above, the wafer W can be carried via the unit blocks B1, B2 between the processing block S2 and the exposure apparatus S4.

Next, one aspect of carrying each wafer W in the resist coating and developing apparatus configured as described above will be discussed with reference to FIGS. 1 to 4 and 13. In this case, in the first storing block 10a of the lowermost stage of the storing blocks 10a to 10d in the rack unit U5, cooling plates CPL9, CPL10 are disposed, comprising two stages. In the second storing block 10b positioned upper than the first storing block 10a, cooling plates CPL1, CPL2 comprising two stages, and a plurality of placing shelves 13 (BUF1) are disposed. In the third storing block 10c positioned upper than the second storing block 10b, cooling plates CPL3, CPL4 comprising two stages and a plurality of placing shelves (BUF2) are disposed. Finally, in the fourth block 10d of the uppermost stage, cooling plates CPL5, CPL6 comprising two stages and a plurality of placing shelves (BUF3) are disposed.

[Aspect of Carrying a Wafer Without an Antireflection Film]

A carrier 20 is carried into the carrier block S1 from the exterior, and a wafer W is taken out from the carrier 20 by the transfer arm C. The wafer W is then carried to the transfer stage TRS1 of the rack unit U5 via the transfer arm C. Thereafter, the wafer W is carried to the cooling plate CPL3 of the third storing block 10c in the rack unit U5 by the transfer arm D, and is then transferred to the main arm A4 of the COT layer B4 via the cooling plate CPL3. Subsequently, the wafer W is carried to the hydrophobicity rendering unit (ADH), by the main arm A4, and subjected to a hydrophobicity rendering process therein, and is then carried to the cooling plate CPL4 of the third storing block 10c of the rack unit U5, where it is cooled to a predetermined temperature. Thereafter, the wafer W picked out from the rack unit U5 by the main arm A4 is carried to the coating unit 32, where a resist film is formed thereon. The wafer W having the resist film formed thereon is then carried to the heating unit (CLHP4) by the main arm A4, and is subjected to a pre-baking process in order to vaporize the solvent from the resist film. Then, the wafer W is stored on one placing shelf BUF 2 of the third storing block 10c of the rack unit U5 by the main arm A4 and waits for a period of time. Thereafter, the transfer arm D is advanced into the placing shelf BUF2 of the third storing block 10c of the rack unit U5 to receive the wafer W, and the wafer W is then transferred to the transfer stage TRS2 of the rack unit U5. Subsequently, the wafer W is carried to the transfer stage ICPL of the rack unit U6 by the shuttle arm A. The wafer on the transfer stage ICPL is then carried to the exposure apparatus S4 by the interface arm E, where it is subjected to a predetermined exposure process.

The wafer W after subjected to the exposure process is then carried to the transfer stage TRS3 of the rack unit U6, where it is transferred to the DEV layer B1 (or DEV layer B2) due to the interface arm E. The wafer W on the stage TRS3 is received by the main arm A1 of the DEV layer B1 (or DEV layer B2), and in the DEV layer B1 (or DEV layer B2), it is subjected to a heat treatment in the heating unit (PEB1). After the heat treatment, the wafer W is carried to the cooling plate CPL7 (CPL8) of the rack unit U6 by the main arm A1 so as to be adjusted at a predetermined temperature. Subsequently, the wafer W is taken out from the rack unit U6 by the main arm A1, and carried to the developing unit 31, where it is coated with a developing liquid. Thereafter, the wafer W is carried to the heating unit (POST1) by the main arm A1, where it is subjected to a predetermined developing process. The wafer W after being subjected to a developing process in this manner is then carried to the cooling plate CPL9 (CPL10) of the first storing block 10a of the rack unit U5, where it is transferred to the transfer arm C. On the cooling plate CPL9 (CPL10), the wafer W is adjusted at a predetermined temperature. Then, it is returned to the original carrier 20 placed on the carrier block S1 due to the transfer arm C.

[Aspect of Carrying a Wafer, in Which an Antireflection Film is Formed Under the Resist Film]

First, a carrier 20 is carried into the carrier block S1 from the exterior, and a wafer W is taken out from the carrier 20 by the transfer arm C. The wafer W is then transferred to the transfer arm D from the transfer arm C. Thereafter, the wafer W is carried to the cooling plate CPL1 of the second storing block 10b in the rack unit U5 by the transfer arm D, and is then transferred to the main arm A3 of the BCT layer B3 via the cooling plate CPL1.

In the BCT layer B3, the wafer W is carried to the first antireflection film forming unit 33, heating unit (CLHP3), and then one of the placing shelves BUF1 of the second storing block 10b of the rack unit U5, in succession, by the main arm A3, so as to form a first antireflection film. The wafer W placed on the placing shelf BUF1 of the second storing block 10b is further carried to the cooling plate CPL3 (CPL4) of the third storing block 10c by the transfer arm D, where it is adjusted at a predetermined temperature.

Subsequently, the wafer W in the third storing block 10c is carried to the coating unit 32, heating unit CLHP4, and then placing shelf BUF2 of the third storing block 10c of the rack unit U5, in succession, by the main arm A4, so as to form a resist film as an upper layer of the first antireflection film.

Thereafter, the transfer arm D is advanced into the placing shelf BUF2 of the third storing block 10c of the rack unit U5, so as to receive the wafer W and transfer it to the transfer stage TRS2 of the rack unit U5. Subsequently, the wafer W is carried to the transfer stage ICPL of the rack unit U6 by the shuttle arm A. The wafer W on the transfer stage ICPL is then carried to the exposure apparatus S4 by the interface arm E, where it is subjected to a predetermined exposure process.

The wafer after being subjected to the exposure process, is then carried to the transfer stage TRS3 of the rack unit U6, heating unit (PEB1), cooling plate CPL7 (CPL8) of the rack unit U6, developing unit 31, and then heating unit (POST1), in succession, by the interface arm E, so as to carry out a predetermined developing process. The wafer after being subjected to a developing process in such a manner, is then carried to the cooling plate CPL9 (CPL10) of the first storing block 10a of the rack unit U5, where it is transferred to the transfer arm C. On the cooling plate CPL9 (CPL10), the wafer W is adjusted at a predetermined temperature. Then, the wafer is returned to the original carrier 20 placed on the carrier block S1 by the transfer arm C.

[Aspect of Carrying a Wafer, in Which an Antireflection Film is Formed on the Resist Film]

First, a carrier 20 is carried into the carrier block S1 from the exterior, and a wafer W is taken out from the carrier 20 by the transfer arm C. The wafer W is then carried to the transfer stage TRS1 of the rack unit U5 via the transfer arm C. Thereafter, the wafer W is carried to the cooling plate CPL3 of the third storing block 10c in the rack unit U5 by the transfer arm D, and is then transferred to the main arm A4 of the COT layer B4 via the cooling plate CPL3. Subsequently, the wafer W is carried to the cooling plate CPL4 of the third storing block 10c of the rack unit U5 via the hydrophobicity rendering unit (ADH), by the main arm A4, so as to be adjusted at a predetermined temperature. Thereafter, the wafer W picked out from the rack unit U5 by the main arm A4 is carried to the coating unit 32, where a resist film is formed thereon. The wafer W having the resist film formed thereon is then carried to the heating unit (CLHP4) by the main arm A4, and is subjected to a pre-baking process in order to vaporize the solvent from the resist film. Then, the wafer W is stored on one placing shelf BUF 2 of the third storing block 10c of the rack unit U5 by the main arm A, and waits for a period of time.

Subsequently, the wafer W in the third storing block 10c is carried by the transfer arm D to the cooling plate CPL5 (CPL6) of the fourth storing block 10d of the rack unit U5, where the wafer is adjusted at a predetermined temperature. Thereafter, the wafer is transferred to the main arm A5 of the TCT layer B5. In the TCT layer B5, the wafer is carried to the second antireflection film forming unit 34, heating unit (CLHP5), and then one of the placing shelves BUF3 of the fourth storing unit 10d of the rack unit U5, in succession, by the main arm A5, so as to form a second antireflection film. In this case, the wafer W may be carried onto one placing shelf BUF3 of the fourth storing block 10d of the rack unit U5 after the wafer is carried to the periphery exposure unit (WEE) to be subjected to a periphery exposure process, after the wafer has been subjected to the heating process by the heating unit (CLHP5).

Thereafter, the transfer arm D is advanced into the placing shelf BUF3 of the fourth storing block 10d of the rack unit U5 to receive the wafer W, and the wafer W is then transferred to the transfer stage TRS2 of the rack unit U5. Subsequently, the wafer W is carried to the transfer stage ICPL of the rack unit U6 by the shuttle arm A. The wafer on the transfer stage ICPL is then carried to the exposure apparatus S4 via the interface arm E, where the wafer is subjected to a predetermined exposure process.

The wafer after being subjected to the exposure process is then carried to the transfer stage TRS3 of the rack unit U6, heating unit (PEB1), cooling plate CPL7 (CPL8) of the rack unit U6, developing unit 31, and then heating unit (POST1), in succession, by the interface arm E, so as to carry out a predetermined developing process. The wafer after being subjected to a developing process in such a manner is then carried to the cooling plate CPL9 (CPL10) of the first storing block 10a of the rack unit U5, where the wafer is transferred to the transfer arm C. On the cooling plate CPL9 (CPL10), the wafer W is adjusted at a predetermined temperature. Then, the wafer is returned to the original carrier 20 placed on the carrier block S1 due to the transfer arm C.

[Aspect of Carrying a Wafer, in Which Antireflection Films are Formed Both on and Under the Resist Film]

In the case of forming antireflection films both over and under the resist film, these antireflection films can be formed both over and under the resist by combining the carrying process, in which an antireflection film is formed under the resist, with the carrying process, in which an antireflection film is formed over the resist, these two aspects being described above. Namely, a carrier 20 is first carried into the carrier block S1 from the exterior, and a wafer W is taken out from the carrier 20 by the transfer arm C. The wafer W is then transferred to the transfer arm D from the transfer arm C. Thereafter, the wafer W is carried to the cooling plate CPL1 of the second storing block 10b in the rack unit U5 by the transfer arm D, and is then transferred to the main arm A3 of the BCT layer B3 via the cooling plate CPL1.

In the BCT layer B3, the wafer W is carried to the first antireflection film forming unit 33, heating unit (CLHP3) and then one of the placing shelves BUF1 of the second storing block 10b of the rack unit U5, in succession, by the main arm A3, so as to form a first antireflection film. The wafer W placed on one placing shelf BUF1 of the second storing block 10b is carried to the cooling plate CPL3 (CPL4) of the third storing block 10c by the transfer arm D, where the wafer is adjusted at a predetermined temperature.

Subsequently, the wafer W in the third storing block 10c is carried to the coating unit 32, heating unit CLHP4, and then one of the placing shelves BUF2 of the third storing block 10c of the rack unit U5, in succession, by the main arm A4, so as to form a resist film as an upper layer of the first antireflection film.

Thereafter, the wafer W in the third storing block 10c is carried by the transfer arm D to the cooling plate CPL5 (CPL6) of the fourth storing block 10d of the rack unit U5, where the wafer is adjusted at a predetermined temperature. Then, the wafer W is transferred to the main arm A5 of the TCT layer B5. In the TCT layer B5, the wafer is carried to the second antireflection film forming unit 34, heating unit (CLHP5), and then one of the placing shelves BUF3 of the fourth storing unit 10d of the rack unit U5, in succession, by the main arm A5, so as to form a second antireflection film. In this case, the wafer W may be carried onto one placing shelf BUF3 of the fourth storing block 10d of the rack unit U5 after the wafer is carried to the periphery exposure unit (WEE) to experience a periphery exposure process, after the wafer has been subjected to the heating process by the heating unit (CLHP5).

Thereafter, the transfer arm D is advanced into the placing shelf BUF3 of the fourth storing block 10d of the rack unit U5 to receive the wafer W, so as to transfer the wafer W to the transfer stage TRS2 of the rack unit U5. Subsequently, the wafer W is carried to the transfer stage ICPL of the rack unit U6 by the shuttle arm A. The wafer on the transfer stage ICPL is then carried to the exposure apparatus S4 by the interface arm E, where the wafer is subjected to a predetermined exposure process.

The wafer W after being subjected to the exposure process is then carried to the transfer stage TRS3 of the rack unit U6, heating unit (PEB1), cooling plate CPL7 (CPL8) of the rack unit U6, developing unit 31, and then heating unit (POST1), in succession, by the interface arm E, so as to carry out a predetermined developing process. The wafer after being subjected to a developing process in such a manner is then carried to the cooling plate CPL9 (CPL10) of the first storing block 10a of the rack unit U5, where the wafer is transferred to the transfer arm C. On the cooling plate CPL9 (CPL10), the wafer W is adjusted at a predetermined temperature, and is then returned to the original carrier 20 placed on the carrier block S1 due to the transfer arm C.

The coating and developing apparatus as described above comprises the control unit 70 consisting of a computer, which performs control of recipes of the respective processing units, control of the schedule of the carrying flow (carrying route) of wafers W, processes in the respective processing units, and driving control of the main arms A1, A3 to A5, transfer arm C, transfer arm D and interface arm E. Namely, the control section 70 generates instructions for driving the respective unit blocks B1 to B5 to carry each wafer W such that it is subjected to each required process.

The schedule of the carrying flow described above designates the carrying route (or order of conveyance) of each wafer W in the respective unit blocks, and is produced depending on the type of the coating film to be formed for each unit block B1 to B5, as such a plurality of schedules of the carrying flow are stored in the control unit 70 for each unit block B1 to B5.

Depending on the type of the coating film to be formed, there may be selected the mode of carrying each wafer W to all of the unit blocks B1 to B5, the mode of carrying each wafer W to the unit block (DEV layer B1, B2) adapted to perform the developing process, the unit block (COT layer B4) adapted to perform the coating process of a resist liquid, and the unit block (BCT layer B3) adapted to form the first antireflection film, the mode of carrying each wafer W to the unit block (DEV layer B1, B2) adapted to perform the developing process, the unit block (COT layer B4) adapted to perform the coating process of a resist liquid, and the unit block (TCT layer B5) adapted to form the second antireflection film, and the mode of carrying each wafer W only to the unit block (DEV layer B1, B2) adapted to perform the developing process. The control section 70 selects, using a mode selecting means incorporated therein, the unit block to which each wafer W is carried, depending on the type of the coating film to be formed, as well as selects optimal recipes from the plurality of schedules of the carrying flow respectively prepared for the unit blocks selected. Thus, due to such selections provided by the control section 70, the unit blocks to be used can be selected depending on the type of the coating film to be formed, and the drive of each of the processing units and arms can be controlled in each unit block so as to carry out a series of processes to be required.

In the coating and developing apparatus as described above, since the unit blocks for forming each coating film and the unit blocks for performing each developing process are respectively provided in separate areas, and the exclusive main arms A1, A3 to A5 and shuttle arm A are provided to each unit block, the load to be imposed on each of the main arms A1, A3 to A5 and shuttle arm A can be reduced. Consequently, the carrying efficiency of each of the main arms A1, A3 to A5 and shuttle arm A can be enhanced, as such improving the throughput.

Moreover, by designing the thicknesses h1, h2 of the arm body 60 (80) of the transfer arm D and the main arms A1, A3 to A5 and shuttle arm A to be substantially the same as the thickness h of each placing shelf 13 (plate-like arm 13a), the arm body 60 (80) of the transfer arm D and the main arms A1, A3 to A5 and shuttle arm A can be advanced into and retracted from the rack unit U5, such that the arms are overlapped to the placing shelf 13 (plate-like arm 13a) in the vertical direction. Thus, the number of the placing shelves 13 can be increased without increasing the height of the rack unit U5, thereby reducing or downsizing the space.

While in the embodiment described above the proximity pins 18a, 18b, 18c are provided to each placing shelf 13, as projections for supporting each wafer W, in place of such proximity pins 18a, 18b, 18c, suction holes may be provided in each placing shelf 13 to perform vacuum suction by connecting these suction holes with a vacuum system.

Figure 14:
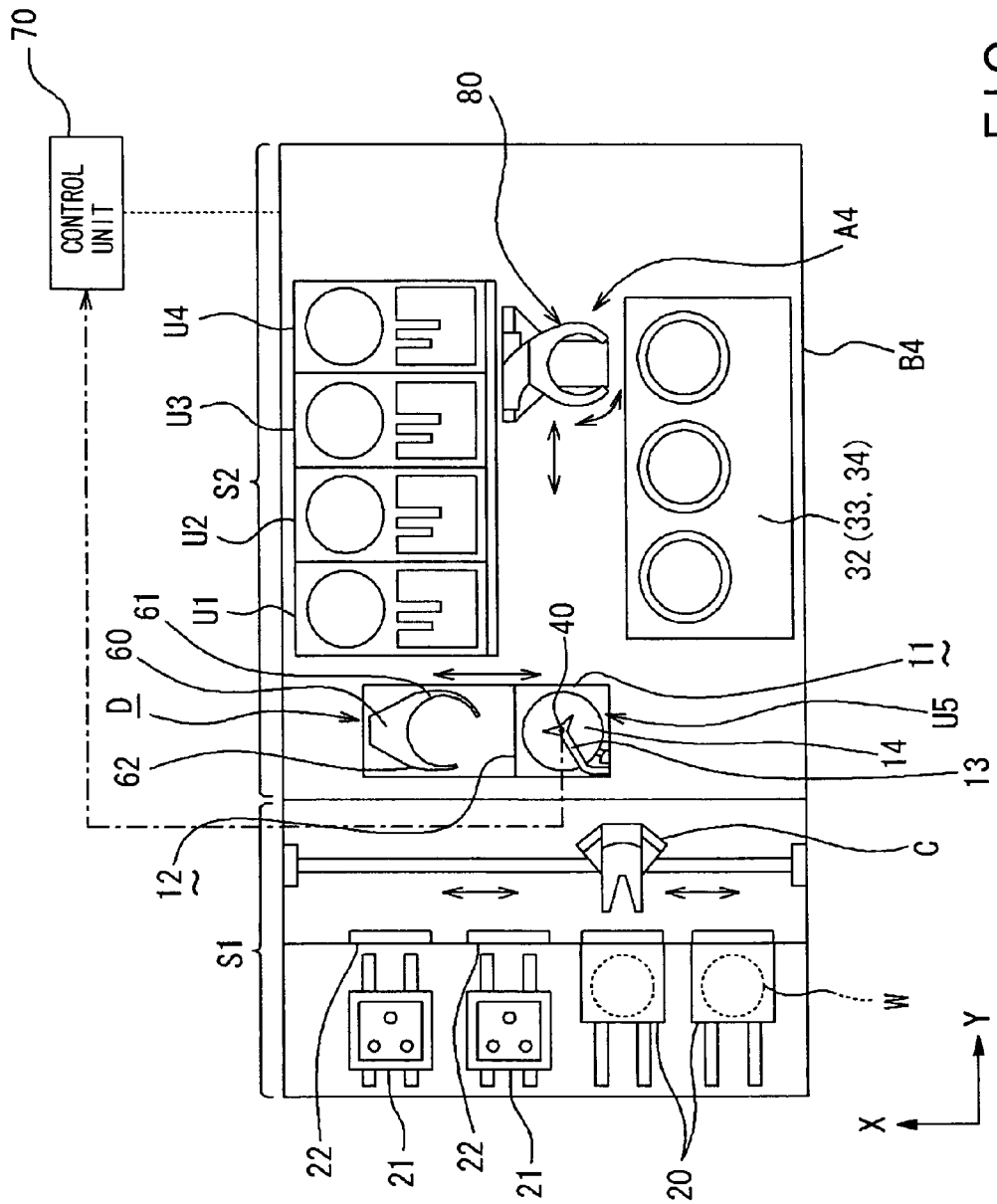
FIG. 14 is a schematic plan view showing a unit block (COT layer) of a processing block of the present invention.

In the embodiment described above, each wafer W may be carried or transferred to the rack unit U5 in response to presence or absence of wafers W on each placing shelf 13 (BUF1 to BUF3) in the second to fourth storing blocks 10b, 10c, 10d of the rack unit U5. Namely, as shown in FIGS. 1 and 14, the control section 70 can recognize the situation of the wafer storage in the storing blocks 10b to 10d of the rack unit U5, by providing a means for detecting presence or absence of the wafer W, for example, a capacitive substrate sensor 40 to each placing shelf 13, and transmitting a signal from the substrate sensor 40 to the control section 70. Thus, the main arms A3 to A5 may be actuated based on each control signal from the control section 70 so as to transfer or carry each wafer W to the placing shelf 13 which is free of the wafer W. In this way, the wafer W can be securely transferred, whereby enhancing the throughput.

While, in the above embodiment, application of the substrate carrying and processing apparatus according to the present invention to a resist coating and developing system for semiconductor wafers has been described, it will, of course, be understood that the substrate carrying and processing apparatus of this invention can also be applied to a resist coating and developing system for LCD glass substrates.

The invention claimed is:

1. A substrate carrying and processing apparatus, comprising:
   a carrier block that positions carriers each able to receive a plurality of substrates therein;
   a processing block including processing units that each provide a proper process to each substrate which is taken out from one of the carriers;
   substrate carrying means that transfers each substrate taken out from the carrier block to each processing unit in the processing block and configured such that the substrate carrying means can be moved at least in the vertical direction and the horizontal direction;
   a substrate storing section which is provided between the carrier block and the processing block and able to store a plurality of substrates therein; and
   substrate transfer means which is able to transfer each substrate to and from the carrier block, that transfers the substrate to the substrate storing section, and configured such that the substrate transfer means can be moved at least in the vertical direction and the horizontal direction,
   wherein the substrate storing section has openings through which the substrate carrying means and the substrate transfer means can transfer each substrate along two directions crossing to each other, and includes a plurality of placing shelves arranged with a space relative to each other and supporting the bottom surface of the substrate,
   wherein the substrate carrying means and substrate transfer means are configured such that they can be advanced into and retracted from the substrate storing section and such that the substrate carrying means and the substrate transfer means can be overlapped to the corresponding placing shelf in the vertical direction, when viewed in the horizontal direction, and
   wherein the space between each adjacent pair of the plurality of placing shelves is designed to be narrower than the thickness of each of the substrate carrying means and the substrate transfer means.

2. The substrate carrying and processing apparatus according to claim 1,
   wherein the processing block includes a coating film forming unit that forms a coating film comprising a resist film on a substrate, an antireflection film forming unit that coats a chemical liquid for forming an antireflection film on the substrate, and a heating unit that heats the substrate, and
   wherein the substrate storing section includes a cooling plate adapted to cool the substrate.

3. The substrate carrying and processing apparatus according to claim 2,
   wherein each placing shelf has a plate-shaped arm configured to extend into the substrate storing section from one side of the substrate storing section,
   wherein pins are provided to project from three points located concentrically at a distal end of each plate-shaped arm such that these pins support the substrate while providing a slight gap between the substrate and the surface of the plate-shaped arm,
   wherein a first pin of said pins is arranged in parallel with the direction, in which the substrate transfer means is advanced into the substrate storing section toward the center of the distal end of the plate-shaped arm, and
   wherein the substrate transfer means includes a horseshoe-shaped arm body including a pair of curved arm pieces, one of the curved arm pieces extending more distally than the other curved arm piece to an extent that it does not interfere with the second and third pins other than said first pin, and supporting nails for supporting the substrate are provided at three points, each located at distal lower portions of both the arm pieces and a proximal lower portion of the arm body.

4. The substrate carrying and processing apparatus according to claim 2,
   wherein each placing shelf has a plate-shaped arm configured to extend into the substrate storing section from one side of the substrate storing section, each plate-shaped arm being placed on another adjacent one and detachably connected and secured thereto, via a spacer and using a connecting means, into a stacked state.

5. The substrate carrying and processing apparatus according to claim 2, further comprising:
a substrate sensor provided to each placing shelf of the substrate storing section and that detects presence or absence of the substrate, and a control means that controls the operation of the substrate carrying means for carrying the substrate to the substrate storing section, based on a signal from the substrate sensor.

6. The substrate carrying and processing apparatus according to claim 1,
wherein each placing shelf has a plate-shaped arm configured to extend into the substrate storing section from one side of the substrate storing section,
wherein pins are provided to project from three points located concentrically at a distal end of each plate-shaped arm such that these pins support the substrate while providing a slight gap between the substrate and the surface of the plate-shaped arm,
wherein a first pin of said pins is arranged in parallel with the direction, in which the substrate transfer means is advanced into the substrate storing section toward the center of the distal end of the plate-shaped arm, and
wherein the substrate transfer means includes a horseshoe-shaped arm body including a pair of curved arm pieces, one of the curved arm pieces extending more distally than the other curved arm piece to an extent that it does not interfere with the second and third pins other than said first pin, and supporting nails for supporting the substrate are provided at three points, each located at distal lower portions of both the arm pieces and a proximal lower portion of the arm body.

7. The substrate carrying and processing apparatus according to claim 1,
wherein each placing shelf has a plate-shaped arm configured to extend into the substrate storing section from one side of the substrate storing section, each plate-shaped arm being placed on another adjacent one and detachably connected and secured thereto, via a spacer and using a connecting means, into a stacked state.

8. The substrate carrying and processing apparatus according to claim 1, further comprising:
a substrate sensor provided to each placing shelf of the substrate storing section and that detects presence or absence of the substrate, and a control means that controls the operation of the substrate carrying means for carrying the substrate to the substrate storing section, based on a signal from the substrate sensor.

9. A substrate carrying and processing apparatus, comprising:
a carrier block that positions carriers each able to receive a plurality of substrates therein;
a processing block including processing units that each provide a proper process to each substrate which is taken out from one of the carriers;
substrate carrying means that transfers each substrate taken out from the carrier block to each processing unit in the processing block and configured such that the substrate carrying means can be moved at least in the vertical direction and the horizontal direction;
a substrate storing section which is provided between the carrier block and the processing block and able to store a plurality of substrates therein; and
substrate transfer means which is able to transfer each substrate to and from the carrier block, that transfers the substrate to the substrate storing section, and configured such that the substrate transfer means can be moved at least in the vertical direction and the horizontal direction,
wherein the substrate storing section has openings through which the substrate carrying means and the substrate transfer means can transfer each substrate along two directions crossing to each other, and includes a plurality of placing shelves arranged with a space relative to each other and supporting the bottom surface of the substrate,
wherein the substrate carrying means and substrate transfer means are configured such that they can be advanced into and retracted from the substrate storing section and such that the substrate carrying means and the substrate transfer means can be overlapped to the corresponding placing shelf in the vertical direction, when viewed in the horizontal direction,
wherein the processing block includes a coating film forming unit that forms a coating film comprising a resist film on a substrate, an antireflection film forming unit that coats a chemical liquid for forming an antireflection film on the substrate, and a heating unit that heats the substrate, and
wherein the substrate storing section includes a cooling plate that cools the substrate.

10. The substrate carrying and processing apparatus according to claim 9,
wherein the processing block includes a coating film forming unit block, a first antireflection film forming unit block, and a second antireflection film forming unit block, which are arranged together into a stacked state,
wherein the coating film forming unit block includes a coating film forming unit that forms a coating film, and a heating unit, the coating film forming unit and the heating unit being located in a horizontal transfer region of the substrate carrying means,
wherein the first antireflection film forming unit block includes a first antireflection film forming unit that forms an antireflection film under the coating film, and a heating unit, the first antireflection film forming unit and the heating unit being located in a horizontal transfer region of the substrate carrying means,
wherein the second antireflection film forming unit block includes a second antireflection film forming unit that forms an antireflection film over the coating film, and a heating unit, the second antireflection film forming unit and the heating unit being located in a horizontal transfer region of the substrate carrying means, and
wherein the substrate storing section includes storing blocks, each including a plurality of placing shelves and a cooling plate provided in the storing block, and corresponding to the coating film forming unit block, the first antireflection film forming unit block and the second antireflection film forming unit block.

11. The substrate carrying and processing apparatus according to claim 10,
wherein each placing shelf has a plate-shaped arm configured to extend into the substrate storing section from one side of the substrate storing section, each plate-shaped arm being placed on another adjacent one and detachably connected and secured thereto, via a spacer and using a connecting means, into a stacked state.

12. The substrate carrying and processing apparatus according to claim 10, further comprising:
a substrate sensor provided to each placing shelf of the substrate storing section and that detects presence or absence of the substrate, and a control means that controls the operation of the substrate carrying means for carrying the substrate to the substrate storing section, based on a signal from the substrate sensor.

13. The substrate carrying and processing apparatus according to claim 10, wherein each placing shelf has a plate-shaped arm configured to extend into the substrate storing section from one side of the substrate storing section, wherein pins are provided to project from three points located concentrically at a distal end of each plate-shaped arm such that these pins support the substrate while providing a slight gap between the substrate and the surface of the plate-shaped arm, wherein a first pin of said pins is arranged in parallel with the direction, in which the substrate transfer means is advanced into the substrate storing section toward the center of the distal end of the plate-shaped arm, and wherein the substrate transfer means includes a horseshoe-shaped arm body including a pair of curved arm pieces, one of the curved arm pieces extending more distally than the other curved arm piece to an extent that it does not interfere with the second and third pins other than said first pin, and supporting nails for supporting the substrate are provided at three points, each located at distal lower portions of both the arm pieces and a proximal lower portion of the arm body.

14. The substrate carrying and processing apparatus according to claim 9, wherein each placing shelf has a plate-shaped arm configured to extend into the substrate storing section from one side of the substrate storing section, wherein pins are provided to project from three points located concentrically at a distal end of each plate-shaped arm such that these pins support the substrate while providing a slight gap between the substrate and the surface of the plate-shaped arm, wherein a first pin of said pins is arranged in parallel with the direction, in which the substrate transfer means is advanced into the substrate storing section toward the center of the distal end of the plate-shaped arm, and wherein the substrate transfer means includes a horseshoe-shaped arm body including a pair of curved arm pieces, one of the curved arm pieces extending more distally than the other curved arm piece to an extent that it does not interfere with the second and third pins other than said first pin, and supporting nails for supporting the substrate are provided at three points, each located at distal lower portions of both the arm pieces and a proximal lower portion of the arm body.

15. The substrate carrying and processing apparatus according to claim 9, wherein each placing shelf has a plate-shaped arm configured to extend into the substrate storing section from one side of the substrate storing section, each plate-shaped arm being placed on another adjacent one and detachably connected and secured thereto, via a spacer and using a connecting means, into a stacked state.

16. The substrate carrying and processing apparatus according to claim 9, further comprising:

a substrate sensor provided to each placing shelf of the substrate storing section and that detects presence or absence of the substrate, and a control means that controls the operation of the substrate carrying means for carrying the substrate to the substrate storing section, based on a signal from the substrate sensor.

17. A substrate carrying and processing apparatus, comprising:

a carrier block that positions carriers each able to receive a plurality of substrates therein;

a processing block including processing units that each provide a proper process to each substrate which is taken out from one of the carriers;

substrate carrying means that transfers each substrate taken out from the carrier block to each processing unit in the processing block and configured such that the substrate carrying means can be moved at least in the vertical direction and the horizontal direction;

a substrate storing section which is provided between the carrier block and the processing block and able to store a plurality of substrates therein; and substrate transfer means which is able to transfer each substrate to and from the carrier block, that transfers the substrate to the substrate storing section, and configured such that the substrate transfer means can be moved at least in the vertical direction and the horizontal direction, wherein the substrate storing section has openings through which the substrate carrying means and the substrate transfer means can transfer each substrate along two directions crossing to each other, and includes a plurality of placing shelves arranged with a space relative to each other and supporting the bottom surface of the substrate, wherein the substrate carrying means and substrate transfer means are configured such that they can be advanced into and retracted from the substrate storing section and such that the substrate carrying means and the substrate transfer means can be overlapped to the corresponding placing shelf in the vertical direction, when viewed in the horizontal direction, wherein each placing shelf has a plate-shaped arm configured to extend into the substrate storing section from one side of the substrate storing section, wherein pins are provided to project from three points located concentrically at a distal end of each plate-shaped arm such that these pins support the substrate while providing a slight gap between the substrate and the surface of the plate-shaped arm, wherein a first pin of said pins is arranged in parallel with the direction, in which the substrate transfer means is advanced into the substrate storing section toward the center of the distal end of the plate-shaped arm, and wherein the substrate transfer means includes a horseshoe-shaped arm body including a pair of curved arm pieces, one of the curved arm pieces extending more distally than the other curved arm piece to an extent that it does not interfere with the second and third pins other than said first pin, and supporting nails for supporting the substrate are provided at three points, each located at distal lower portions of both the arm pieces and a proximal lower portion of the arm body.

18. A substrate carrying and processing apparatus, comprising:

a carrier block that positions carriers each able to receive a plurality of substrates therein;

a processing block including processing units that each provide a proper process to each substrate which is taken out from one of the carriers;

substrate carrying means that transfers each substrate taken out from the carrier block to each processing unit in the processing block and configured such that the substrate carrying means can be moved at least in the vertical direction and the horizontal direction;

a substrate storing section which is provided between the carrier block and the processing block and able to store a plurality of substrates therein; and substrate transfer means which is able to transfer each substrate to and from the carrier block, that transfers the substrate to the substrate storing section, and configured such that the substrate transfer means can be moved at least in the vertical direction and the horizontal direction, wherein the substrate storing section has openings through which the substrate carrying means and the substrate transfer means can transfer each substrate along two directions crossing to each other, and includes a plurality of placing shelves arranged with a space relative to each other and supporting the bottom surface of the substrate, wherein the substrate carrying means and substrate transfer means are configured such that they can be advanced into and retracted from the substrate storing section and such that the substrate carrying means and the substrate transfer means can be overlapped to the corresponding placing shelf in the vertical direction, when viewed in the horizontal direction, and wherein each placing shelf has a plate-shaped arm configured to extend into the substrate storing section from one side of the substrate storing section, each plate-shaped arm being placed on another adjacent one and detachably connected and secured thereto, via a spacer and using a connecting means, into a stacked state.

19. A substrate carrying and processing apparatus, comprising:

a carrier block that positions carriers each able to receive a plurality of substrates therein;

a processing block including processing units that each provide a proper process to each substrate which is taken out from one of the carriers;

substrate carrying means that transfers each substrate taken out from the carrier block to each processing unit in the processing block and configured such that the substrate carrying means can be moved at least in the vertical direction and the horizontal direction;

a substrate storing section which is provided between the carrier block and the processing block and able to store a plurality of substrates therein; and substrate transfer means which is able to transfer each substrate to and from the carrier block, that transfers the substrate to the substrate storing section, and configured such that the substrate transfer means can be moved at least in the vertical direction and the horizontal direction, wherein the substrate storing section has openings through which the substrate carrying means and the substrate transfer means can transfer each substrate along two directions crossing to each other, and includes a plurality of placing shelves arranged with a space relative to each other and supporting the bottom surface of the substrate, wherein the substrate carrying means and substrate transfer means are configured such that they can be advanced into and retracted from the substrate storing section and such that the substrate carrying means and the substrate transfer means can be overlapped to the corresponding placing shelf in the vertical direction, when viewed in the horizontal direction, and wherein the substrate carrying and processing apparatus further includes a substrate sensor provided to each placing shelf of the substrate storing section and that detects presence or absence of the substrate, and a control means that controls the operation of the substrate carrying means for carrying the substrate to the substrate storing section, based on a signal from the substrate sensor.

* * * * *